(12) United States Patent
Miyazawa et al.

(10) Patent No.: US 11,381,150 B2
(45) Date of Patent: Jul. 5, 2022

(54) SEMICONDUCTOR SWITCH CONTROL CIRCUIT AND SWITCHING POWER SOURCE DEVICE

(71) Applicant: SHINDENGEN ELECTRIC MANUFACTURING CO., LTD., Tokyo (JP)

(72) Inventors: Wataru Miyazawa, Saitama (JP); Kenichi Suzuki, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 107 days.

(21) Appl. No.: 16/957,728

(22) PCT Filed: Dec. 28, 2017

(86) PCT No.: PCT/JP2017/047342
§ 371 (c)(1),
(2) Date: Jun. 25, 2020

(87) PCT Pub. No.: WO2019/130577
PCT Pub. Date: Jul. 4, 2019

(65) Prior Publication Data
US 2020/0373827 A1    Nov. 26, 2020

(51) Int. Cl.
*H02M 1/00* (2006.01)
*H02M 1/08* (2006.01)
(Continued)

(52) U.S. Cl.
CPC ........... *H02M 1/08* (2013.01); *H02M 1/4225* (2013.01); *H03K 17/687* (2013.01)

(58) Field of Classification Search
CPC .... H02M 1/08; H02M 1/4225; H02M 1/0029; H03K 17/687; H03K 17/162
See application file for complete search history.

(56) References Cited

U.S. PATENT DOCUMENTS 5,986,484 A    11/1999  Kimata
6,144,245 A *  11/2000  Balogh ............... H03K 17/161
                                                327/380
(Continued)

FOREIGN PATENT DOCUMENTS

JP    H1023743 A     1/1998
JP    2000232347 A   8/2000
(Continued)

OTHER PUBLICATIONS

International Search Report in PCT/JP2017/047342, dated Mar. 6, 2018. 4pp.

*Primary Examiner* — Adolf D Berhane
*Assistant Examiner* — Afework S Demisse
(74) *Attorney, Agent, or Firm* — Hauptman Ham, LLP

(57) ABSTRACT

A semiconductor switch control circuit configured to perform an ON/OFF control of a semiconductor switch and includes: a pulse signal generating part configured to generate a pulse signal; a drive current generating part configured to generate a drive current based on the pulse signal which the pulse signal generating part generates and supplies the drive current to a gate electrode of the semiconductor switch; a gate voltage detecting part configured to detect a gate voltage VGS of the semiconductor switch; and a drive current control part configured to control the drive current which the drive current generating part generates based on the pulse signal which the pulse signal generating part generates and the gate voltage VGS which the gate voltage detecting part detects.

14 Claims, 14 Drawing Sheets

(51) Int. Cl.
*H02M 1/42* (2007.01)
*H03K 17/687* (2006.01)

(56) References Cited

U.S. PATENT DOCUMENTS

| | | | |
|---|---|---|---|
| 6,351,107 B1* | 2/2002 | Okita | H03K 17/04213 323/289 |
| 2009/0015224 A1 | 1/2009 | Hirao et al. | |
| 2013/0083442 A1 | 4/2013 | Hiyama | |
| 2013/0314020 A1 | 11/2013 | Sugie | |

FOREIGN PATENT DOCUMENTS

| JP | 2001352748 A | 12/2001 |
|---|---|---|
| JP | 2002136130 A | 5/2002 |
| JP | 200922106 A | 1/2009 |
| JP | 2012227877 A | 11/2012 |
| JP | 201377976 A | 4/2013 |
| JP | 2013247584 A | 12/2013 |

* cited by examiner

SEMICONDUCTOR SWITCH CONTROL CIRCUIT AND SWITCHING POWER SOURCE DEVICE

RELATED APPLICATIONS

The present Application is a National phase of International Application number PCT/JP2017/047342, filed Dec. 28, 2017.

TECHNICAL FIELD

The present invention relates to a semiconductor switch control circuit and a switching power source device.

BACKGROUND ART

Recently, along with the progress of the development of next generation devices which use a wide band gap semiconductor made of SiC or GaN. For example, the expectation for a highly efficient and miniaturized switching power source device 101 shown in FIG. 12 has been increased. Under such expectation, a wide band gap semiconductor which is a semiconductor switch having a considerably small ON resistance thus having a considerably high switching speed compared to a conventional semiconductor has been attracting attention.

The switching power source device 101 is a so-called PFC step-up chopper circuit, increases an inputted voltage to a desired voltage, and supplies the predetermined voltage to a load not shown in the drawing from a pair of output terminals. A wide band gap semiconductor (for example, silicon carbide, gallium nitride, gallium oxide, diamond or the like) is used as a semiconductor switch 106 of such a switching power source device 101, it is possible to realize the acquisition of high efficiency and miniaturization of the device due to characteristics of the semiconductor switch 106 such as low ON resistance and high speed switching.

PRIOR ART DOCUMENT

Patent Document

Patent document 1: JP 2009-22106 A

SUMMARY OF INVENTION

Problem to be Solved by the Invention

However, when a wide band gap semiconductor is used as a semiconductor switch, although high speed switching can be realized, as shown in FIG. 13, there is a concern that unexpected self-oscillation is generated due to a parasitic capacitor or a parasitic inductor during a turn-off period. Particularly, when a threshold value of a semiconductor switch of the wide band gap semiconductor is low, the semiconductor switch is erroneously operated due to self-oscillation thus giving rise to a possibility that the semiconductor switch or a circuit part around the semiconductor switch is broken.

In view of the above, in the above-mentioned switching power source device, as described in patent document 1, a technique is considered where a negative-voltage-use power source is added to the switching power source device, and a gate voltage during a turn-off period is biased to a negative voltage. However, the switching power source device which is obtained by adding the negative-voltage-use power source to the switching power source device has the complicated configuration. Further, even when such a configuration is adopted, self-oscillation is generated at the timing that a large switching current flows such as at the time of starting a power source or when an overload is applied thus eventually bringing about a possibility that a semiconductor switch or a circuit part around the semiconductor switch is broken (see a gate voltage waveform in an overload region shown in FIG. 14). In a load characteristic diagram shown in FIG. 14 (a load characteristic diagram having a so-called drooping characteristic), the diagram shows a load characteristic in a case where an overcurrent restricting and protecting circuit which has a fixed power drooping characteristic at a predetermined output current (power) or more and has a winding drooping characteristic generated by a burst control circuit below a predetermined output current (power) is used. As shown in FIG. 14, an operation between a point B (switching point to a burst control) and a point C (switching stop point) is subjected to a burst control and hence, a switching current is restricted whereby the above-mentioned self-oscillation is minimally generated. However, an operation between a point A (drooping start point) and the point B is subjected to a fixed power drooping control and hence, a maximum current flows as a switching current whereby the above-mentioned concern exists. This concern exists also at the time of starting a switching power source.

The present invention has been made in view of the above-mentioned circumstances, and it is an object of the present invention to provide a semiconductor switch control circuit where self-oscillation is minimally generated even at the timing that a large switching current flows such as at the time of starting a power source or when an overload is applied.

Solution to Problem

According to an aspect of the present invention, there is provided a semiconductor switch control circuit configured to perform an ON/OFF control of a semiconductor switch having a source electrode, a drain electrode and a gate electrode by supplying a drive current to the gate electrode, the semiconductor switch control circuit including: a pulse signal generating part configured to generate a pulse signal which becomes a time reference for performing the ON/OFF control of the semiconductor switch; a drive current generating part configured to generate a drive current based on the pulse signal which the pulse signal generating part generates and to supply the drive current to the gate electrode of the semiconductor switch; a gate voltage detecting part configured to detect a gate voltage of the semiconductor switch; and a drive current control part configured to control the drive current which the drive current generating part generates based on the pulse signal which the pulse signal generating part generates and the gate voltage which the gate voltage detecting part detects.

According to the semiconductor switch control circuit of the present invention, it is preferable that the drive current control part be configured, when a self-oscillation phenomenon of the gate voltage is detected during a first period after starting a first plateau period of the gate voltage during a turn-off period, to control the drive current so as to set a lowering speed of the gate voltage lower than the lowering speed of the gate voltage before the detection of the self-oscillation phenomenon.

According to the semiconductor switch control circuit of the present invention, it is preferable that the drive current control part be configured, when the gate voltage exceeds a first set voltage which is higher than a threshold voltage of the semiconductor switch by a predetermined value during the first period after starting of the first plateau period of the gate voltage during the turn-off period, to control the drive current so as to set the lowering speed of the gate voltage lower than the lowering speed of the gate voltage before the detection of the self-oscillation phenomenon.

According to the semiconductor switch control circuit of the present invention, it is preferable that the drive current control part be capable of setting a plurality of voltage levels as the first set voltage, and be configured to control the drive current such that the lowering speed of the gate voltage is decreased in a stepwise manner in accordance with a phenomenon that the gate voltage exceeds a higher voltage level among the plurality of voltage levels during the first period.

According to the semiconductor switch control circuit of the present invention, it is preferable that the drive current control part be configured, only when the gate voltage exceeds the first set voltage plural times during the first period, to control the drive current so as to set the lowering speed of the gate voltage lower than the lowering speed of the gate voltage before the detection of the self-oscillation phenomenon.

According to the semiconductor switch control circuit of the present invention, it is preferable that the semiconductor switch control circuit further include a current detecting part which is configured to detect any one of a drain current or a source current of the semiconductor switch, or a load current or an input current of a switching power source device including the semiconductor switch, wherein the drive current control part be configured, only when the current exceeds a predetermined first set current during an ON period of the semiconductor switch, to control the drive current so as to set the lowering speed of the gate voltage lower than the lowering speed of the gate voltage before the detection of the self-oscillation phenomenon.

According to the semiconductor switch control circuit of the present invention, it is preferable that the drive current control part be configured, when a self-oscillation phenomenon of the gate voltage is detected during a second plateau period of the gate voltage during a turn-on period, to control the drive current so as to set a rising speed of the gate voltage lower than the rising speed of the gate voltage before the detection of the self-oscillation phenomenon.

According to the semiconductor switch control circuit of the present invention, it is preferable that the drive current control part be configured, when the gate voltage exceeds a second set voltage which is higher than a threshold voltage of the semiconductor switch by a predetermined value during a second plateau period of the gate voltage during the turn-on period, to control the drive current so as to set the rising speed of the gate voltage lower than the rising speed of the gate voltage before the detection of the self-oscillation phenomenon.

According to the semiconductor switch control circuit of the present invention, it is preferable that the drive current control part be capable of setting a plurality of voltage levels as the second set voltage, and be configured to control the drive current such that the rising speed of the gate voltage is decreased in a stepwise manner in accordance with a phenomenon that the gate voltage exceeds a higher voltage level among the plurality of voltage levels during the second plateau period.

According to the semiconductor switch control circuit of the present invention, it is preferable that the drive current control part be configured, only when the gate voltage exceeds the second set voltage plural times during the second plateau period, to control the drive current so as to set the rising speed of the gate voltage lower than the rising speed of the gate voltage before the detection of the self-oscillation phenomenon.

According to the semiconductor switch control circuit of the present invention, it is preferable that the semiconductor switch control circuit further include: a current detecting part which is configured to detect any one of a drain current or a source current of the semiconductor switch, or a load current or an input current of a switching power source device including the semiconductor switch, wherein the drive current control part be configured, only when the current exceeds a predetermined second set current during an ON period of the semiconductor switch, to control the drive current so as to set the rising speed of the gate voltage lower than the rising speed of the gate voltage before the detection of the self-oscillation phenomenon.

According to the semiconductor switch control circuit of the present invention, it is preferable that the drive current generating part include a charge/discharge circuit which has a charge current source for charging a current to the gate electrode of the semiconductor switch and a discharge current source for discharging the current from the gate electrode of the semiconductor switch, and the drive current control part be configured to control the drive current by controlling a charge current charged to the gate electrode of the semiconductor switch or a discharge current discharged from the gate electrode of the semiconductor switch.

According to the semiconductor switch control circuit of the present invention, it is preferable that the semiconductor switch be formed of a wide gap semiconductor.

According to the semiconductor switch control circuit of the present invention, it is preferable that the wide gap semiconductor be formed of silicon carbide, gallium nitride, gallium oxide or diamond.

According to another aspect of the present invention, there is provided a switching power source device which includes: a semiconductor switch having a source electrode, a drain electrode and a gate electrode; and a semiconductor switch control circuit configured to perform an ON/OFF control of the semiconductor switch with a supply of a drive current to the gate electrode of the semiconductor switch, wherein the switching power source device includes the semiconductor switch control circuits according to any one of claims 1 to 14 as the semiconductor switch control circuit.

Advantageous Effects of Invention

The semiconductor switch control circuit and the switching power source device according to the present invention include the drive current control part which controls a drive current which the drive current generating part generates based on a pulse signal which the pulse signal generating part generates and a gate voltage which the gate voltage detecting part detects. Accordingly, by controlling a drive current such that a lowering speed of a gate voltage or a rising speed of the gate voltage is decreased (slow) at the timing that a large switching current flows such as a time that the power source is started or a time that an overload is applied (see FIG. 3, FIG. 5, FIG. 6 and FIG. 8), it is possible to provide the semiconductor switch control circuit and the switching power source device where a phenomenon that a semiconductor switch or a circuit part around the semiconductor switch is broken due to self-oscillation and an erroneous operation of the semiconductor switch caused by the self-oscillation even at the timing that the large switching current flows such as the time that the power source is started or the time that an overload is applied (see FIG. 4 and FIG. 7).

DESCRIPTION OF EMBODIMENTS

Hereinafter, a semiconductor switch control circuit and a switching power source device according to the present invention are described based on embodiments shown in drawings.

Embodiment 1

1. Semiconductor Switch Control Circuit 16 and Switching Power Source Device 1 According to Embodiment 1

Figure 1:
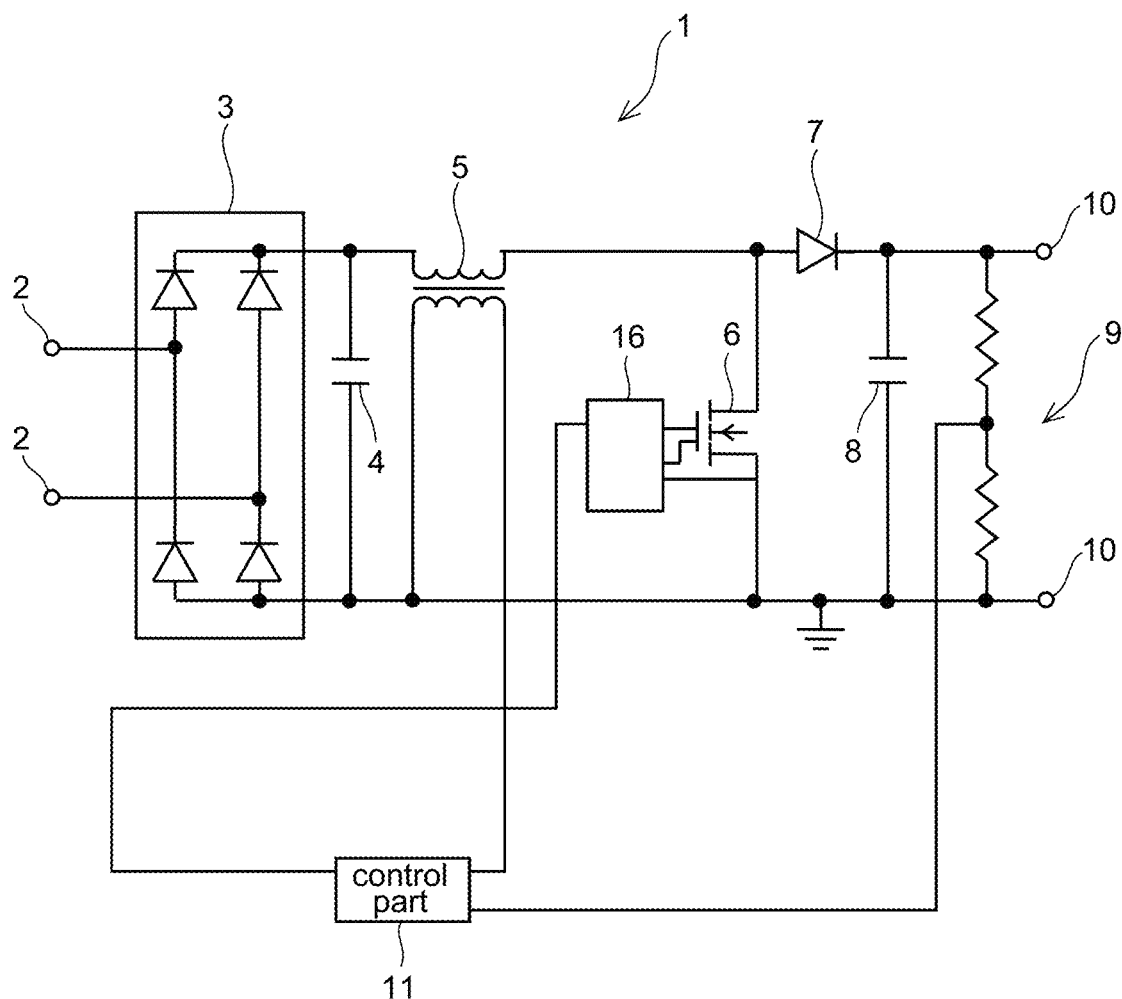
FIG. 1 is a circuit diagram of a switching power source device 1 according to an embodiment 1.
Figure 2:
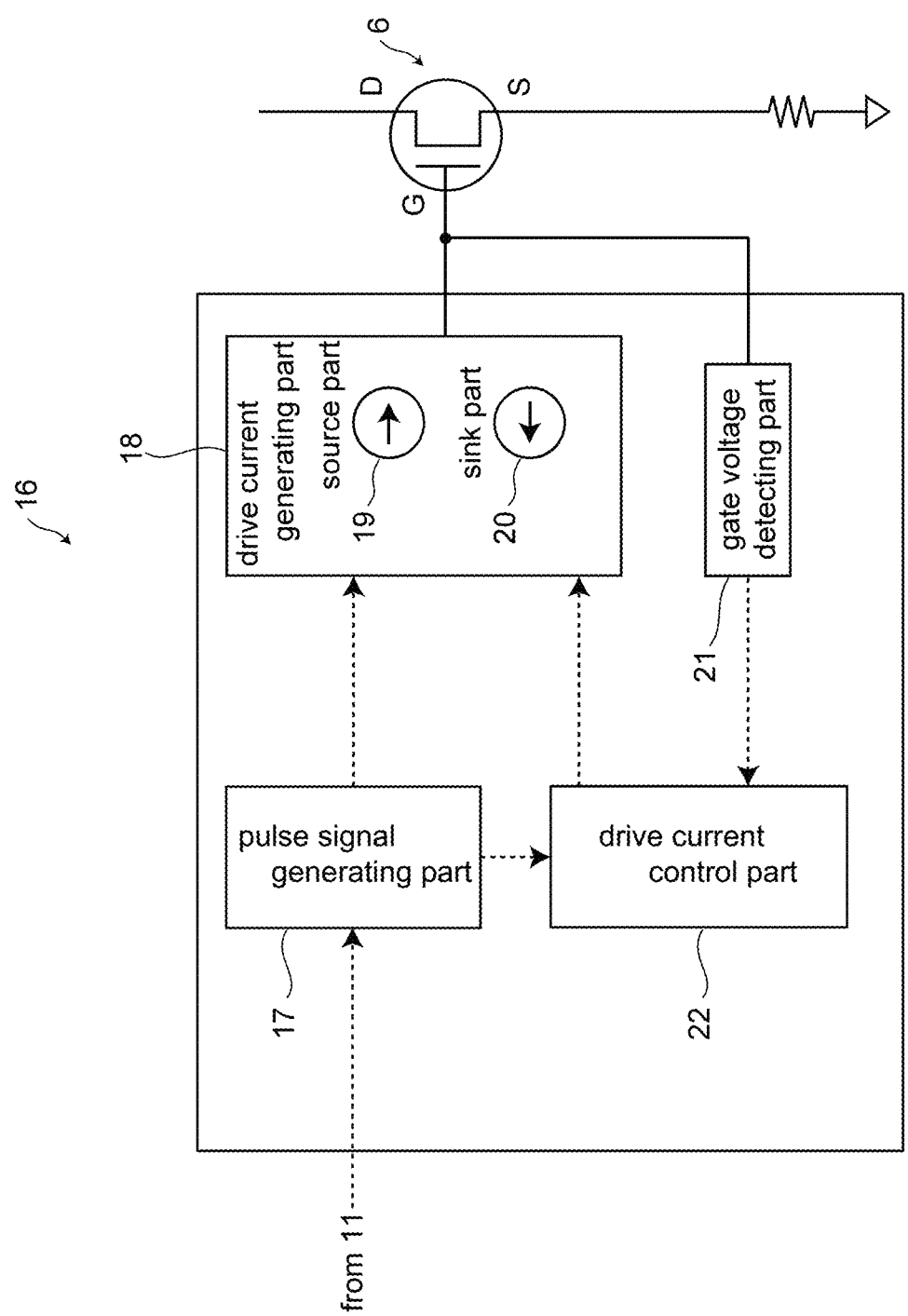
FIG. 2 is a view for describing a semiconductor switch control circuit 16 according to the embodiment 1.

In the embodiment 1, the semiconductor switch control circuit and the switching power source device according to the present invention are described using a case where the semiconductor switch control circuit according to the present invention is applied to a switching power source device formed of a critical-mode-type step-up chopper. FIG. 1 is a circuit diagram of the switching power source device 1 (the switching power source device 1 according to the embodiment 1) which uses the semiconductor switch control circuit 16 according to the embodiment 1. FIG. 2 is a view for describing the semiconductor switch control circuit 16 according to the embodiment 1.

The switching power source device 1 according to the embodiment 1 is a critical-mode-type PFC step-up chopper circuit. The switching power source device 1 increases an inputted voltage to a desired voltage, and supplies the desired voltage to a load not shown in the drawing from a pair of output terminals. In the switching power source device 1 according to the embodiment 1, a wide band gap semiconductor (for example, silicon carbide, gallium nitride, gallium oxide, diamond or the like) is used as a semiconductor switch 6, and it is possible to realize the acquisition of high efficiency and miniaturization of the device due to characteristics of the semiconductor switch 6 such as low ON resistance and high speed switching.

The switching power source device 1 having the above-mentioned configuration includes, as a semiconductor switch control circuit, the semiconductor switch control circuit 16 (the semiconductor switch control circuit 16 according to the embodiment 1) described hereinafter.

As shown in FIG. 2, the semiconductor switch control circuit 16 according to the embodiment 1 is a semiconductor switch control circuit which performs an ON/OFF control of the semiconductor switch 6 having a source electrode, a drain electrode and the gate electrode by supplying a drive current to a gate electrode of the semiconductor switch 6. The semiconductor switch control circuit 16 includes: a pulse signal generating part 17 which generates a pulse signal which becomes a time reference for performing an ON/OFF control of the semiconductor switch 6; a drive current generating part 18 which generates a drive current based on the pulse signal which the pulse signal generating part 17 generates, and supplies the drive current to the gate electrode of the semiconductor switch 6; a gate voltage detecting part 21 which detects a gate voltage of the semiconductor switch 6; and a drive current control part 22 which controls the drive current which the drive current generating part 18 generates based on the pulse signal which the pulse signal generating part 17 generates and the gate voltage which the gate voltage detecting part 21 detects.

The drive current generating part 18 includes a charge/discharge circuit which has a charge current source (expressed as a source part 19 in FIG. 2) which charges a current to the gate electrode of the semiconductor switch 6 and a discharge current source (expressed as a sink part 20 in FIG. 2) which discharges a current from the gate electrode of the semiconductor switch 6. The drive current control part 22 controls a drive current by controlling a charge current which is charged to the gate electrode of the semiconductor switch 6 or a discharge current which is discharged from the gate electrode of the semiconductor switch 6.

Figure 3:
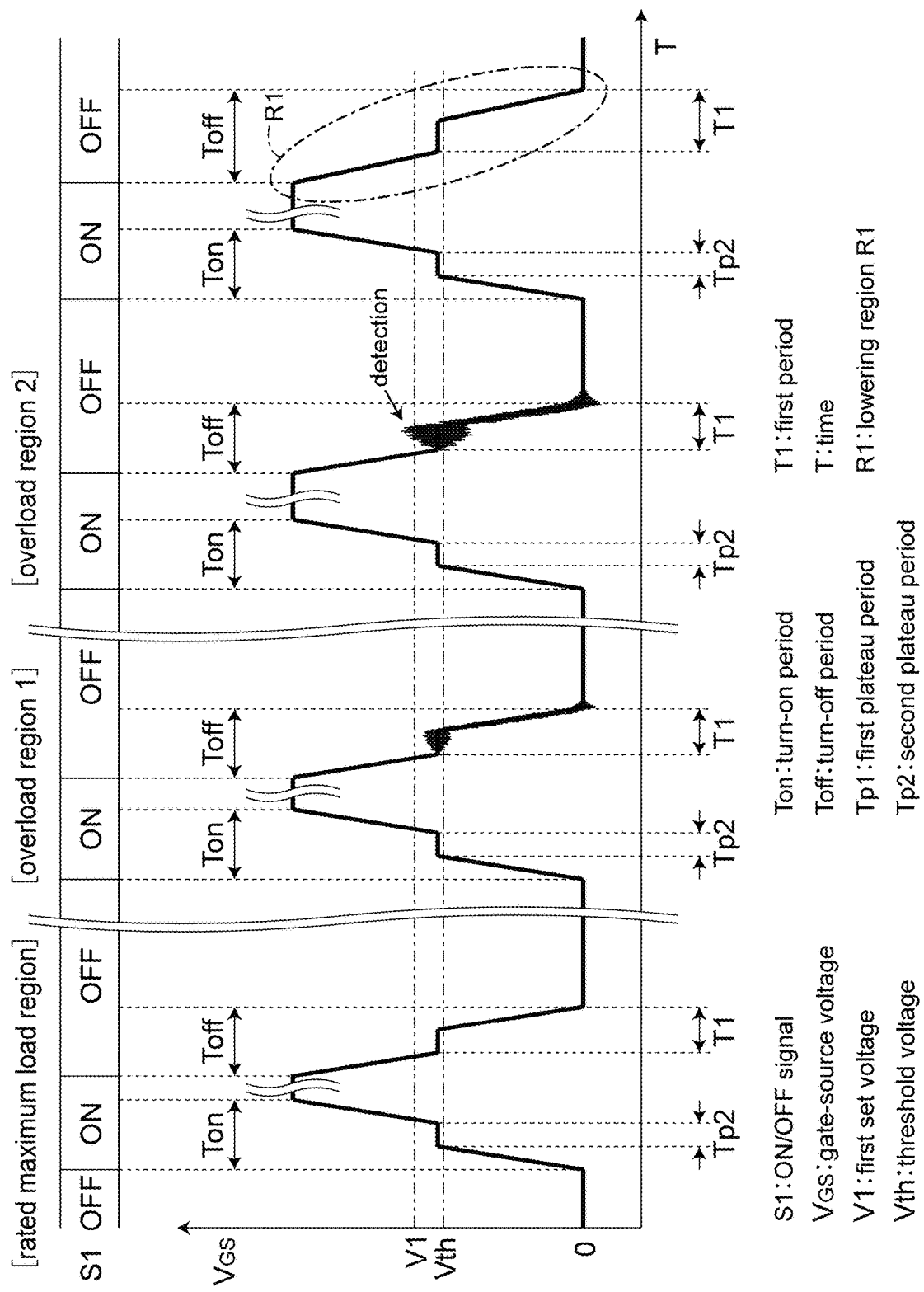
FIG. 3 is a view schematically showing a waveform of a gate voltage $V_{GS}$ at the time of performing a switching operation in the switching power source device 1 according to the embodiment 1.
Figure 14:
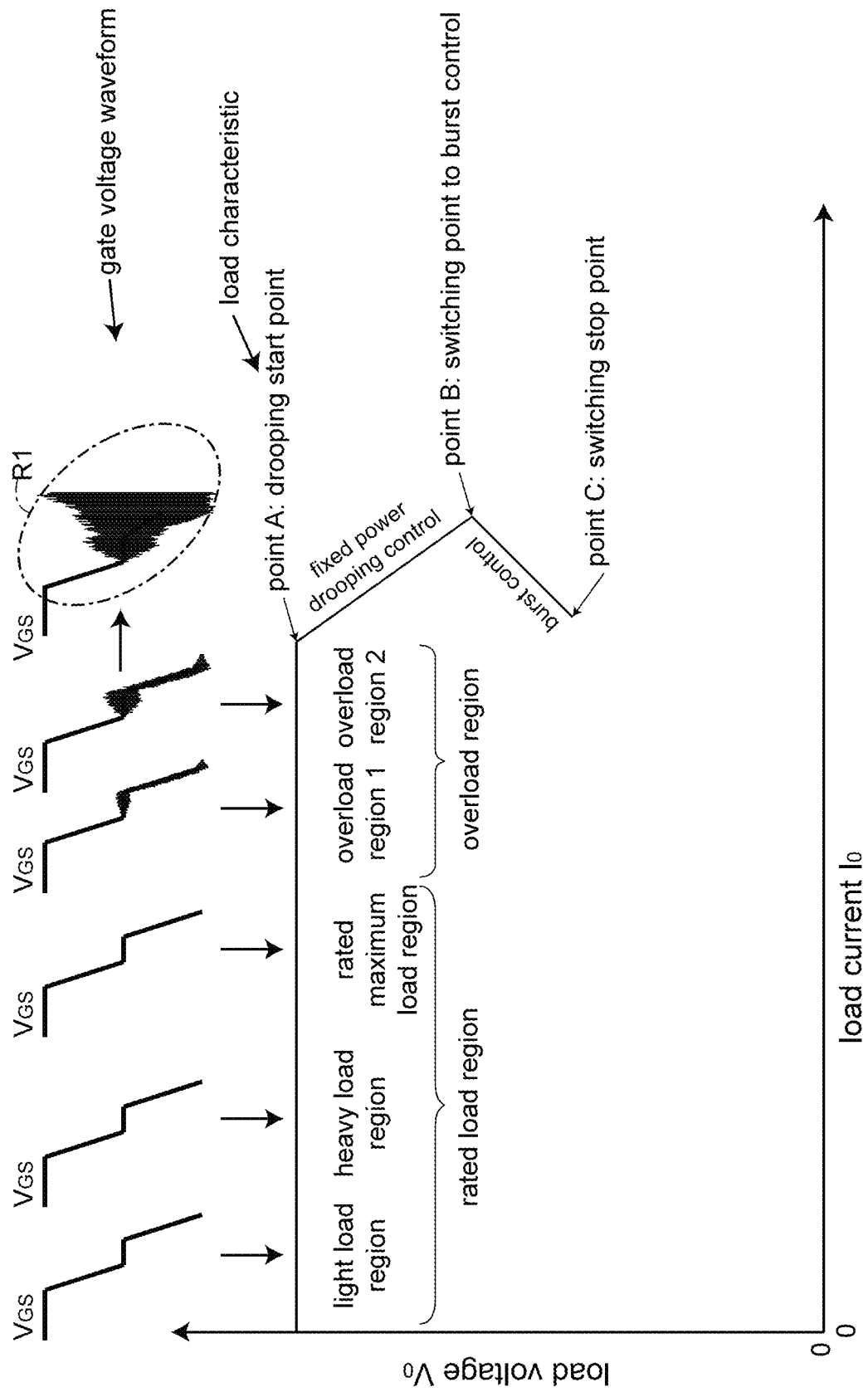
FIG. 14 is a view schematically showing the waveform of the gate voltage $V_{GS}$ at the time of turning off the semiconductor switch 106 in the conventional switching power source device 101 for every load region together with a load characteristic diagram.

FIG. 3 is a view schematically showing a waveform of a gate voltage $V_{GS}$ at the time of performing a switching operation in the switching power source device 1 according to the embodiment 1. In the drawing, the waveform of the gate voltage $V_{GS}$ on the most left side is the waveform of the gate voltage $V_{GS}$ in a rated maximum load region, the waveform of the second gate voltage $V_{GS}$ as counted from the left side is the waveform of the gate voltage $V_{GS}$ in an overload region 1, and the waveforms of the third and fourth gate voltages $V_{GS}$ as counted from the left side are the waveforms of the gate voltages $V_{GS}$ in an overload region 2. The waveform of the fourth gate voltage $V_{GS}$ as counted from the left side is the waveform of the gate voltage $V_{GS}$ when a lowering speed of the gate voltage $V_{GS}$ during a turn-off period is decreased (see symbol R1). The rated maximum load region is a region where the load is largest among rated load regions. The overload region 1 is a region where the load is relatively light among the overload regions, and the overload region 2 is a region where the load is relatively heavy among the overload regions (see FIG. 14).

Figure 4:
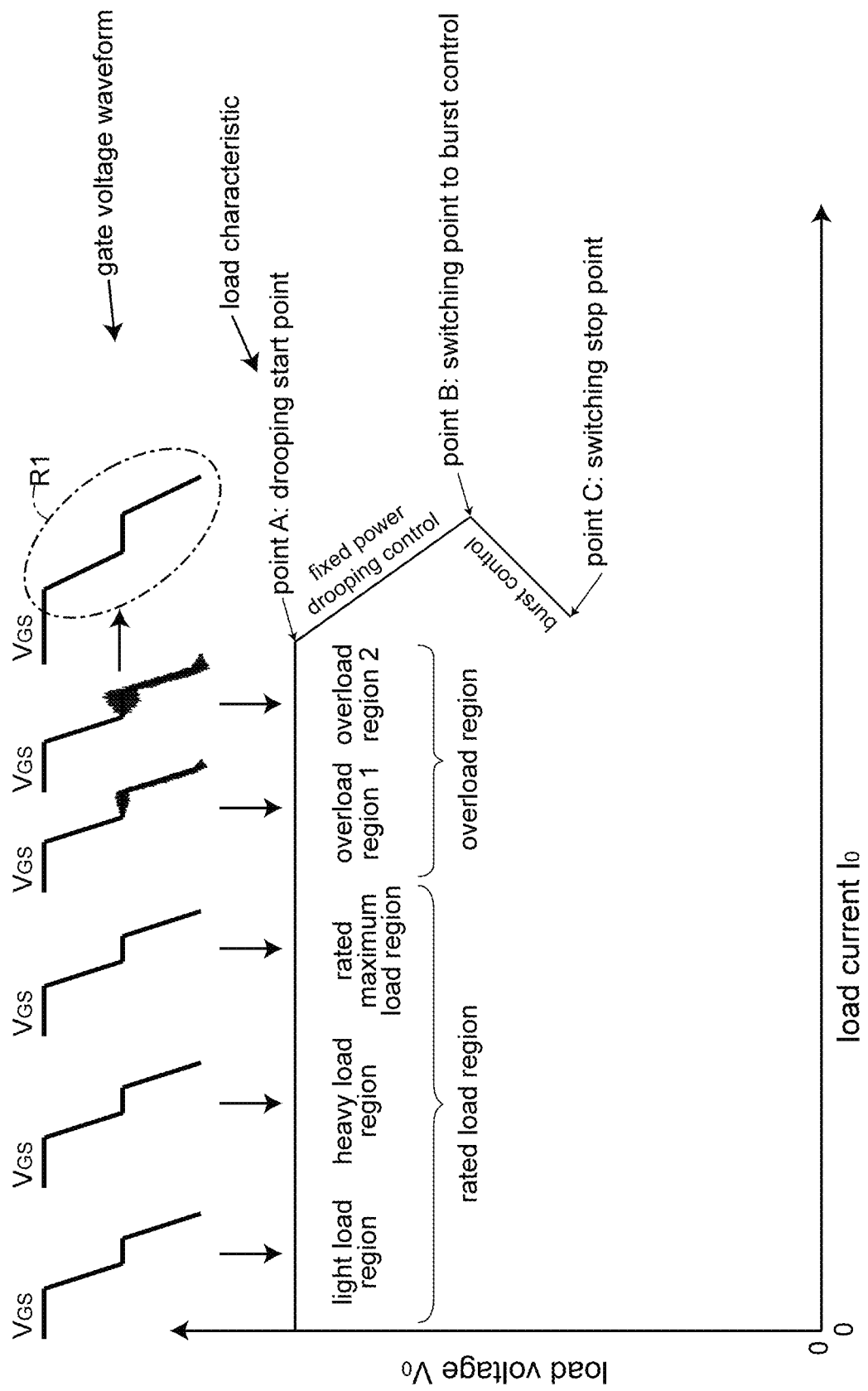
FIG. 4 is a view schematically showing the waveform of a gate voltage $V_{GS}$ at the time of turning off a semiconductor switch 6 in the switching power source device 1 according to the embodiment 1 for every load region together with a load characteristic diagram.

FIG. 4 is a view schematically showing the waveform of a gate voltage $V_{GS}$ at the time of turning off semiconductor switch 6 in the switching power source device 1 according to the embodiment 1 for every load region together with a load characteristic diagram. In the drawing, the waveform of the gate voltage $V_{GS}$ on the most left side is the waveform of the gate voltage $V_{GS}$ in a light load region, the waveform of the second gate voltage $V_{GS}$ as counted from the left side is the waveform of the gate voltage $V_{GS}$ in a heavy load region, and the waveform of the third gate voltages $V_{GS}$ as counted from the left side is the waveforms of the gate voltages $V_{GS}$ in the rated maximum load region, the waveform of the fourth gate voltage $V_{GS}$ as counted from the left side is the waveform of the gate voltage $V_{GS}$ in the overload region 1, and the waveforms of the fifth and sixth gate voltage $V_{GS}$ as counted from the left side are the waveforms of the gate voltage $V_{GS}$ in the overload region 2. The waveform of the sixth gate voltage $V_{GS}$ as counted from the left side is the waveform of the gate voltage $V_{GS}$ when a lowering speed of the gate voltage $V_{GS}$ during the turn-off period is decreased (see symbol R1). The light load region is a region where the load is relatively light among the rated load regions, and the heavy load region is a region where the load is heavier than the light load region among the rated load regions, and the load is lighter than the rated maximum load region (see FIG. 14).

Figure 13:
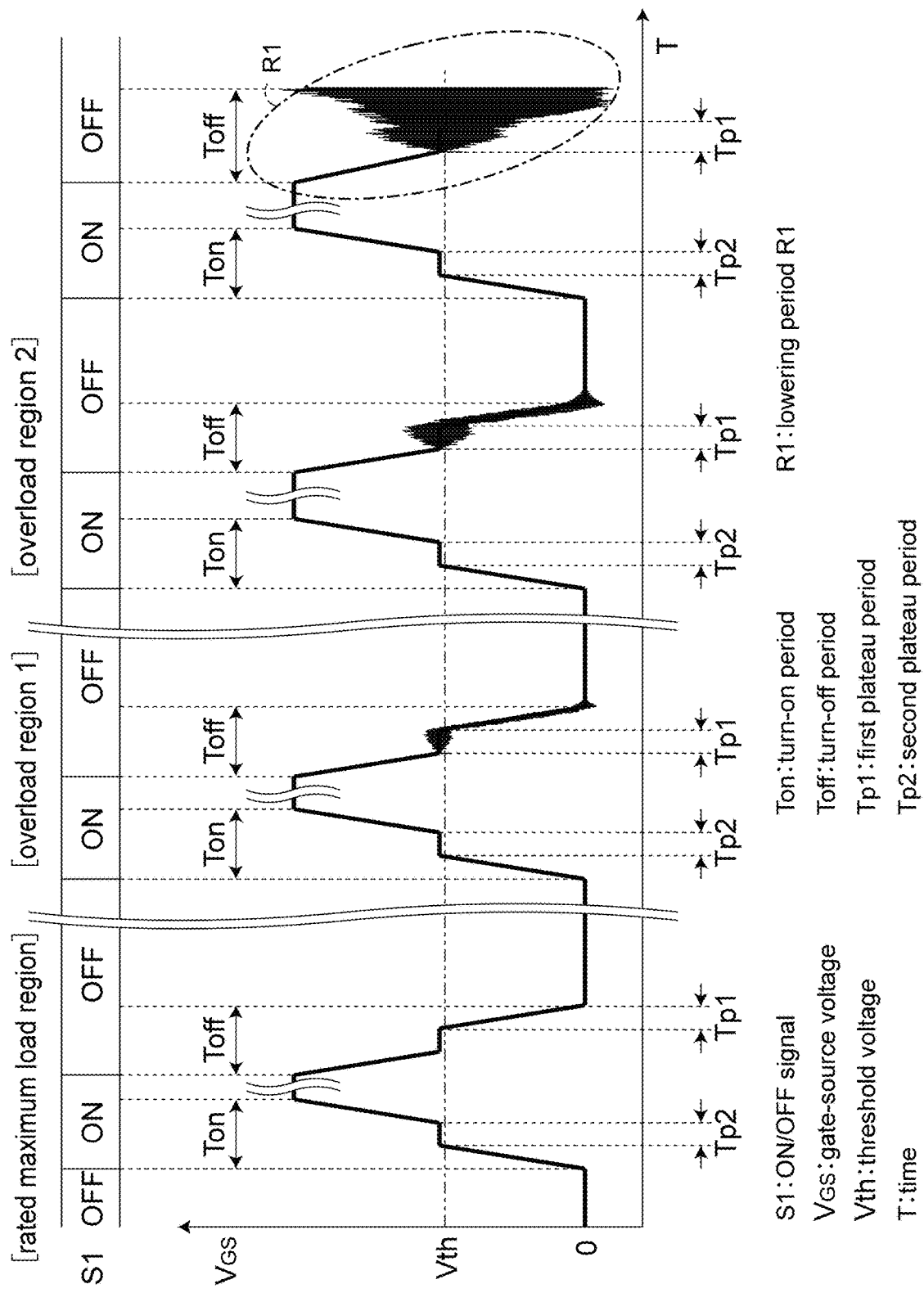
FIG. 13 is a view schematically showing a waveform of a gate voltage $V_{GS}$ at the time of turning off a semiconductor switch 106 in the conventional switching power source device 101.

As shown in FIG. 3, in the semiconductor switch control circuit 16 according to the embodiment 1, when a self-oscillation phenomenon of the gate voltage $V_{GS}$ which a gate voltage detecting part 21 detects is detected during a first period T1 after starting a first plateau period Tp1 (see FIG. 13) of the gate voltage $V_{GS}$ during a turn-off period Toff, the drive current control part 22 controls a drive current so as to set a lowering speed of the gate voltage $V_{GS}$ lower than the corresponding lowering speed of the gate voltage $V_{GS}$ before the detection of the self-oscillation phenomenon. More specifically, when the gate voltage $V_{GS}$ which the gate voltage detecting part 21 detects exceeds a first set voltage V1 which is higher than the threshold voltage Vth of the semiconductor switch 6 by a predetermined value during the first period T1 after starting the first plateau period Tp1 of the gate voltage $V_{GS}$ in the turn-off period Toff, the drive current control part 22 controls a drive current so as to set the lowering speed of the gate voltage $V_{GS}$ lower than the corresponding lowering speed before the detection of the self-oscillation phenomenon.

That is, the generation of the self-oscillation at the time of turning off the semiconductor switch 6 starts when the load goes beyond the rated maximum load region and falls in the overload region 1, and is increased when the load falls in the overload region 2. In such an operation, when the situation is left as it is, the self-oscillation is extremely increased as in the case of the prior art thus giving rise to a case where a semiconductor switch is erroneously operated due to such self-oscillation so that the semiconductor switch or a circuit part around the semiconductor switch is broken (see the waveform of the gate voltage $V_{GS}$ in the overload region 2 in FIG. 13 and FIG. 14). To the contrary, in the semiconductor switch control circuit 16 according to the embodiment 1, when the load falls in the overload region 2 (when the gate voltage $V_{GS}$ goes beyond the first set voltage V1), a drive current is controlled such that a lowering speed of the gate voltage $V_{GS}$ becomes lower than the lowering speed before the detection of the self-oscillation phenomenon and hence, the self-oscillation is suppressed. As a result, it is possible to maintain the self-oscillation at a level where an erroneous operation of the semiconductor switch 6 is not induced (see the waveform of the gate voltage $V_{GS}$ in the overload region 2 shown in FIG. 3 and FIG. 4).

In the semiconductor switch control circuit 16 according to the embodiment 1, assume a case where a gate voltage $V_{GS}$ which the gate voltage detecting part 21 detects during the first period T1 exceeds a first set voltage V1. In such a case, a lowering speed is not readily decreased (lowered) during the turn-off period, but is decreased (lowered) during a turn-off period after the semiconductor switch is turned on by a next ON signal. With such a configuration, a control of the drive current control part 22 can be performed at a speed which is not so high.

In a case where the first set voltage V1 is set to a voltage slightly higher than the threshold voltage Vth of the semiconductor switch 6, although a self-oscillation suppressing effect is increased, a turn-off period is prolonged and a switching speed becomes excessively slow. Accordingly, such setting of the first set voltage V1 is not desirable. On the other hand, in a case where the first set voltage V1 is set to a voltage considerably higher than the threshold voltage Vth of the semiconductor switch 6, a self-oscillation suppressing effect cannot be sufficiently acquired. Accordingly, such setting of the first set voltage V1 is not desirable. From this point of view, it is preferable to set the first set voltage V1 to a value which takes into account the self-oscillation suppressing effect and the turn-off period.

Figure 5:
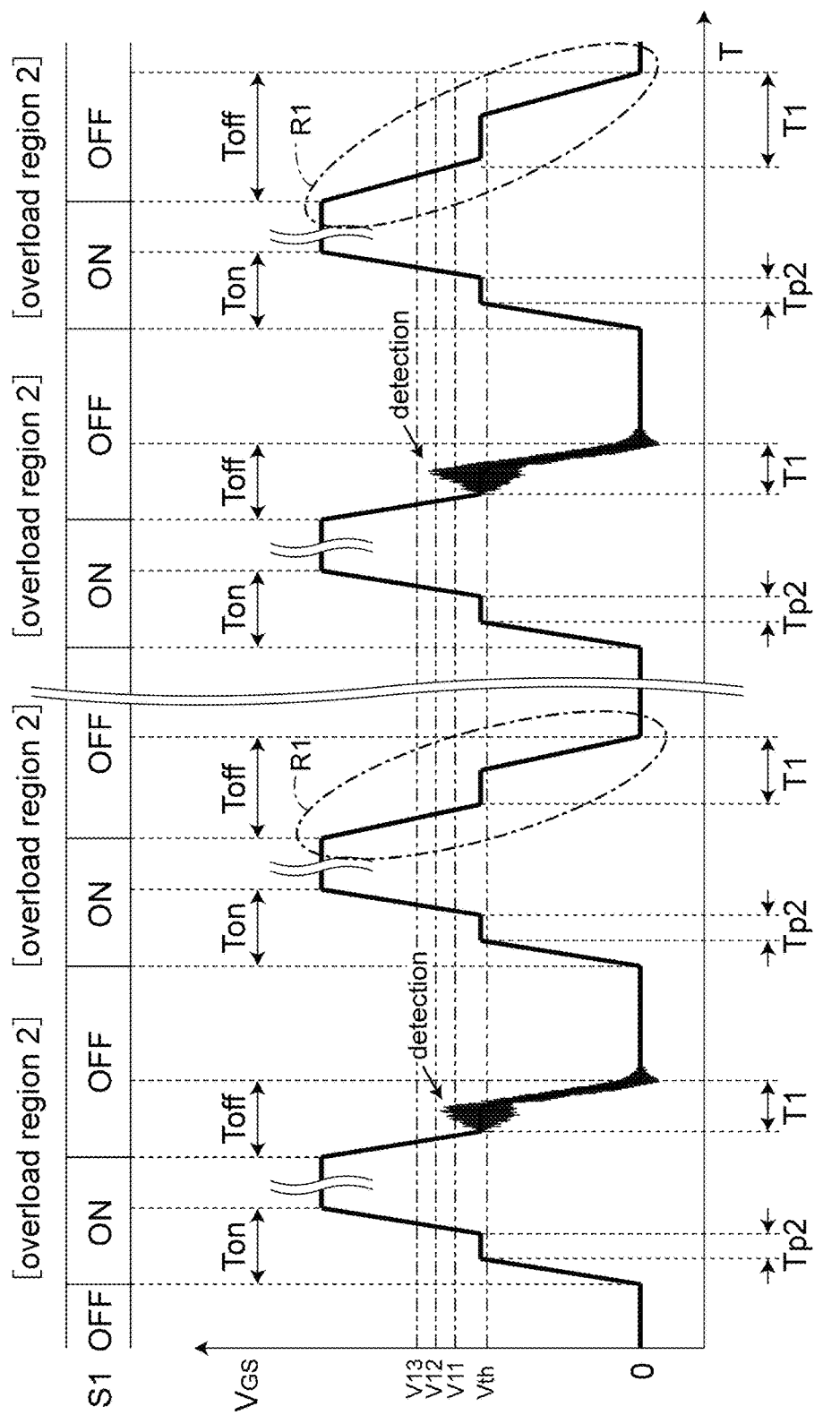
FIG. 5 is a view schematically showing the waveform of the gate voltage $V_{GS}$ at the time of performing the switching operation in a case where a plurality of voltage levels are set as a first set voltage V1 in the switching power source device 1 according to the embodiment 1.

FIG. 5 is a view schematically showing the waveform of the gate voltage $V_{GS}$ at the time of performing the switching operation in a case where a plurality of voltage levels are set as the first set voltage V1 in the switching power source device 1 according to the embodiment 1. In the drawing, the waveforms of two gate voltages $V_{GS}$ on the left side are the waveform of the gate voltage $V_{GS}$ when the gate voltage $V_{GS}$ exceeds a first set voltage V11 in the overload region 2 and the waveform of the gate voltage $V_{GS}$ when a lowering speed of the gate voltage $V_{GS}$ is decreased (see symbol R1) corresponding to such a phenomenon (the detection of a state where the gate voltage $V_{GS}$ exceeds the first set voltage V11). The waveforms of two gate voltages $V_{GS}$ on the right side are the waveform of the gate voltage $V_{GS}$ when the gate voltage $V_{GS}$ exceeds a first set voltage V12 (higher than the first set voltage V11) in the overload region 2 and the waveform of the gate voltage $V_{GS}$ when a lowering speed of the gate voltage $V_{GS}$ is further decreased (see symbol R1) corresponding to such a phenomenon (the detection of a state where the gate voltage $V_{GS}$ exceeds the first set voltage V12).

In the semiconductor switch control circuit 16 according to the embodiment 1, as shown in FIG. 5, the drive current control part 22 may set a plurality of voltage levels (V11 to V13) as the first set voltage V1 and control a drive current such that a lowering speed of the gate voltage $V_{GS}$ is decreased in a stepwise manner in accordance with a phenomenon that the gate voltage $V_{GS}$ exceeds the higher voltage level among the plurality of voltage levels. With such a configuration, the lowering speed of the gate voltage can be properly controlled corresponding to a degree of danger that self-oscillation is generated and hence, it is possible to acquire a necessary self-oscillation suppressing effect without unnecessarily prolonging a turn-off period.

As shown in FIG. 5, as the plurality of voltage levels, for example, three voltage levels can be set. However, the present invention is not limited to such a case and, for example, two or four or more voltage levels can be set. As values of the plurality of voltage levels, appropriate values can be set so as to properly control a lowering speed of the gate voltage corresponding to a degree of danger that the self-oscillation is generated.

In the semiconductor switch control circuit 16 according to the embodiment 1, the drive current control part 22 may control a drive current so as to set a lowering speed of the gate voltage $V_{GS}$ lower than the lowering speed of the gate voltage $V_{GS}$ before the detection of the self-oscillation phenomenon only when the gate voltage $V_{GS}$ which the gate voltage detecting part detects exceeds the first set voltage V1 plural times during the first period T1. With such a configuration, self-oscillation can be effectively suppressed without unnecessarily prolonging a turn-off period by excluding an effect caused by singularly generated noise which does not lead to self-oscillation.

The number of times expressed by "plural times" may be preliminarily set such as twice, three times, four times, or five times. However, the number of times expressed by "plural times" may be set corresponding to a height of the above-mentioned "first set voltage V1". In this case, it is desirable to set the number of times expressed by "plural times" such that the height of "first set voltage V1" and the number of times expressed by "plural times" have the negative correlation. For example, when "first set voltage V1" is set high, the number of times expressed by "plural times" is decreased. Also with such a configuration, a lowering speed of the gate voltage can be properly controlled corresponding to a degree of danger that self-oscillation is generated and hence, self-oscillation can be effectively suppressed without unnecessarily prolonging a turn-off period.

It has been described heretofore that the semiconductor switch control circuit 16 according to the embodiment 1 is a semiconductor switch control circuit which minimally generates self-oscillation at the time of turning off the semiconductor switch 6. However, the semiconductor switch control circuit 16 according to the embodiment 1 also becomes a semiconductor switch control circuit which minimally generates self-oscillation at the time of turning on the semiconductor switch 6. In this case, it is particularly effective when the semiconductor switch control circuit 16 is applied to a switching power source device where self-oscillation is liable to be generated at the time of turning on the semiconductor switch 6 in the switching power source device (for example, a switching power source device formed of a continuous-type step-up chopper).

Figure 6:
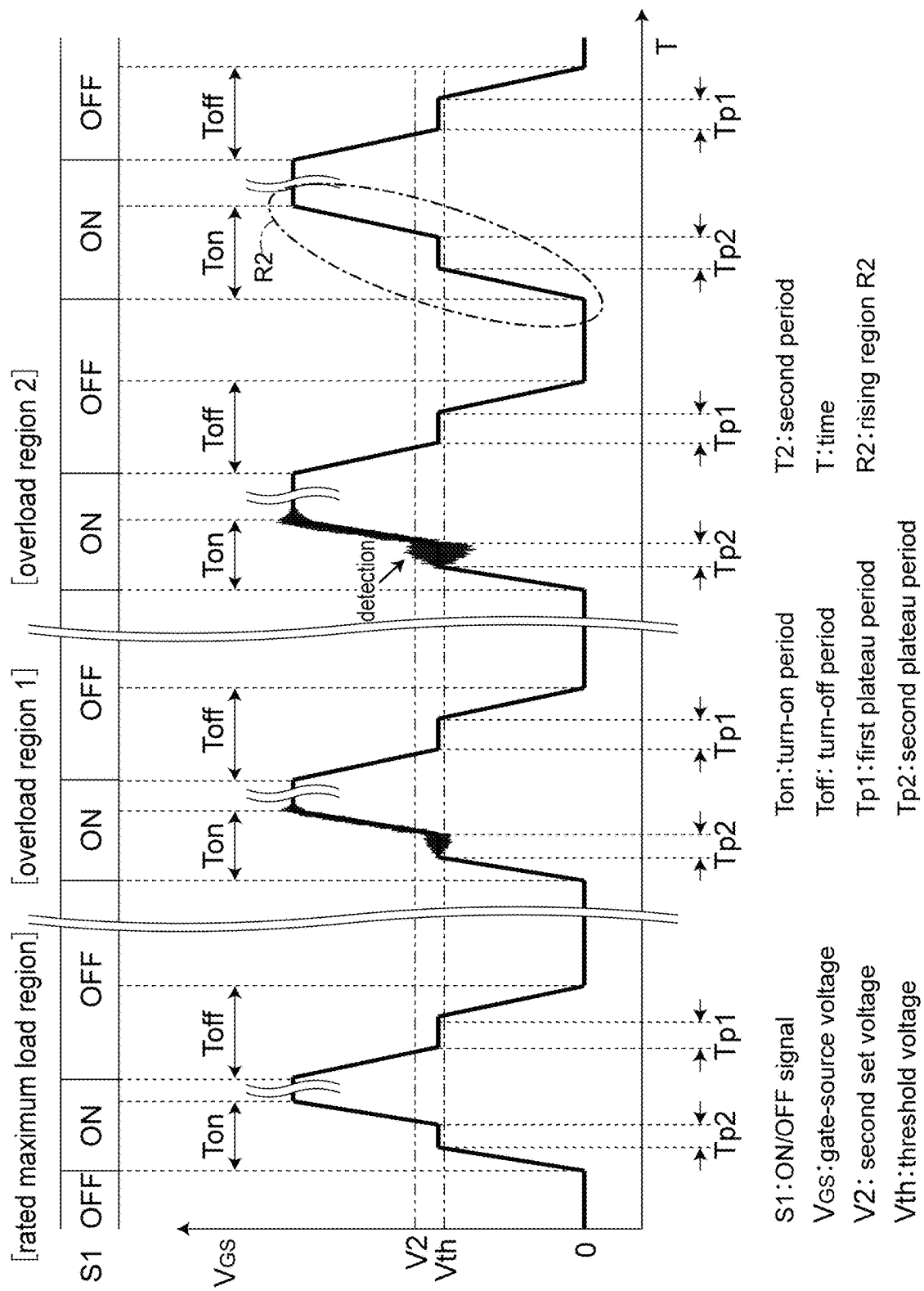
FIG. 6 is a view schematically showing the waveform of the gate voltage $V_{GS}$ at the time of performing the switching operation in the switching power source device according to the embodiment 1.

FIG. 6 is a view schematically showing the waveform of the gate voltage $V_{GS}$ at the time of performing the switching operation in the switching power source device 1 according to the embodiment 1. In the drawing, the waveform of the gate voltage $V_{GS}$ on the most left side is the waveform of the gate voltage $V_{GS}$ in the rated maximum load region, the waveform of the second gate voltage $V_{GS}$ as counted from the left side is the waveform of the gate voltage $V_{GS}$ in the overload region 1, and the waveforms of the third and fourth gate voltages $V_{GS}$ as counted from the left side are the waveforms of the gate voltages $V_{GS}$ in the overload region 2. The waveform of the fourth gate voltage $V_{GS}$ as counted from the left side is the waveform of the gate voltage $V_{GS}$ when a rising speed of the gate voltage $V_{GS}$ during a turn-on period is decreased (see symbol R2).

Figure 7:
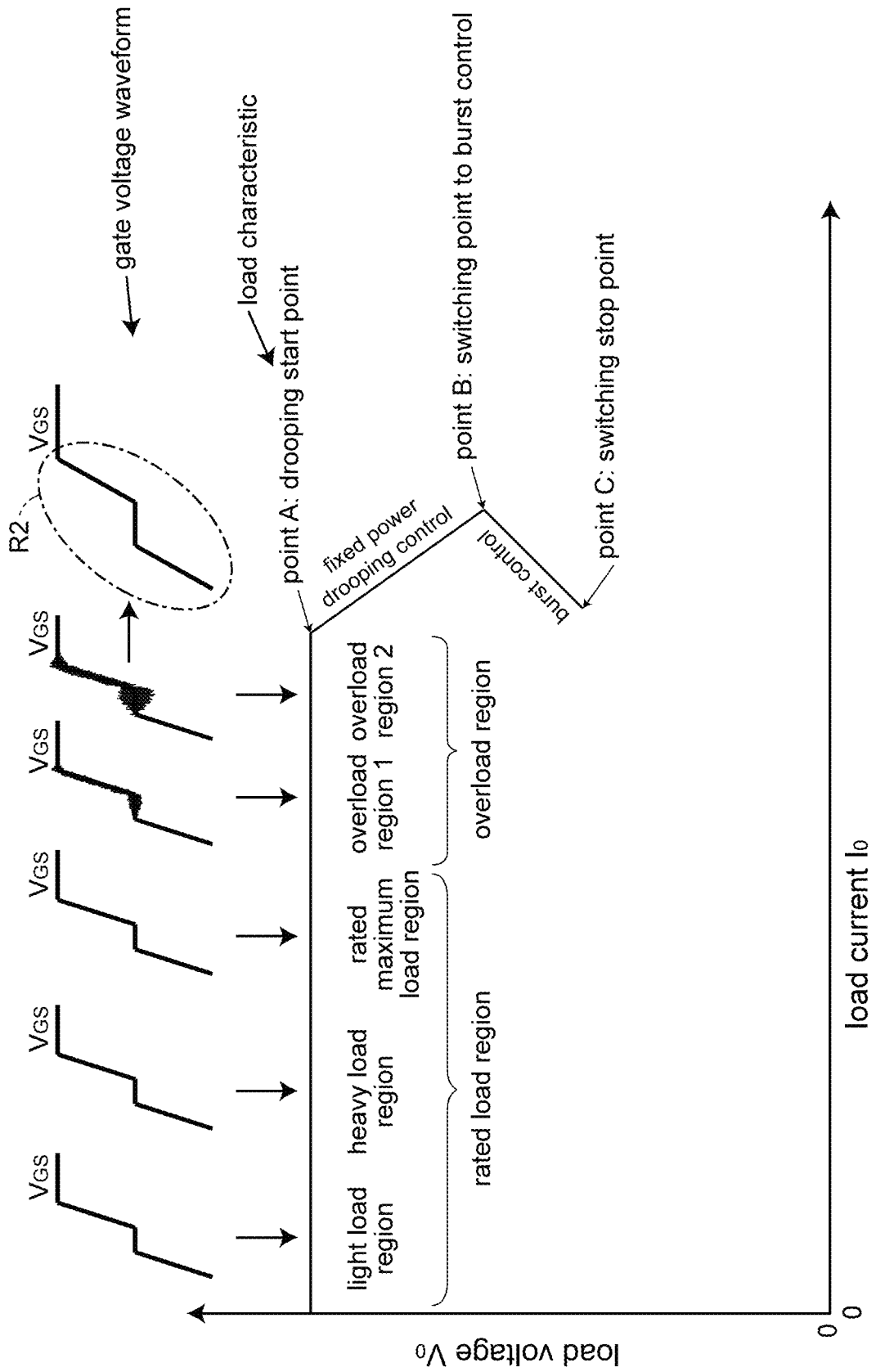
FIG. 7 is a view schematically showing the waveform of the gate voltage $V_{GS}$ at the time of turning on a semiconductor switch 6 in the switching power source device according to the embodiment 1 for every load region in together with a load characteristic diagram.

FIG. 7 is a view schematically showing the waveform of the gate voltage $V_{GS}$ at the time of turning on the semiconductor switch 6 according to the embodiment 1 for every load region in together with a load characteristic diagram. In the drawing, the waveform of the gate voltage $V_{GS}$ on the most left side is the waveform of the gate voltage $V_{GS}$ in the light load region, the waveform of the second gate voltage $V_{GS}$ as counted from the left side is the waveform of the gate voltage $V_{GS}$ in the heavy load region, and the waveform of the third gate voltages $V_{GS}$ as counted from the left side is the waveforms of the gate voltages $V_{GS}$ in the rated maximum load region, the waveform of the fourth gate voltage $V_{GS}$ as counted from the left side is the waveform of the gate voltage $V_{GS}$ in the overload region 1, and the waveforms of the fifth and sixth gate voltage $V_{GS}$ as counted from the left side are waveforms of the gate voltage $V_{GS}$ in the overload region 2. The waveform of the sixth gate voltage $V_{GS}$ as counted from the left side is the waveform of the gate voltage $V_{GS}$ when a rising speed of the gate voltage $V_{GS}$ during the turn-on period is decreased (see symbol R2).

As shown in FIG. 6, in the semiconductor switch control circuit 16 according to the embodiment 1, when a self-oscillation phenomenon of the gate voltage $V_{GS}$ which the gate voltage detecting part detects is detected during a second plateau period Tp2 of the gate voltage $V_{GS}$ during a turn-on period Ton, the drive current control part 22 controls a drive current so as to set a rising speed of the gate voltage $V_{GS}$ lower than the rising speed of the gate voltage $V_{GS}$ before the detection of the self-oscillation phenomenon. More specifically, when the gate voltage $V_{GS}$ which the gate voltage detecting part 21 detects exceeds a second set voltage V2 which is higher than the threshold voltage Vth of the semiconductor switch 6 by a predetermined value during a second plateau period Tp2 of the gate voltage $V_{GS}$ in the turn-on period Ton, the drive current control part 22 controls a drive current so as to set the rising speed of the gate voltage $V_{GS}$ lower than the rising speed before the detection of the self-oscillation phenomenon.

That is, the generation of the self-oscillation at the time of turning on the semiconductor switch 6 starts when the load goes beyond the rated maximum load region and falls in the overload region 1, and is increased when the load falls in the overload region 2. In such an operation, when the situation is left as it is, the self-oscillation is extremely increased as in the case of turning off the semiconductor switch 6 thus giving rise to a case where a semiconductor switch is erroneously operated due to such self-oscillation so that the semiconductor switch or a circuit part around the semiconductor switch is broken. To the contrary, in the semiconductor switch control circuit according to the embodiment 1, when the load falls in the overload region 2 (when the gate voltage $V_{GS}$ goes beyond the second set voltage V2), a drive current is controlled such that a rising speed of the gate voltage $V_{GS}$ becomes lower than the rising speed before the detection of the self-oscillation phenomenon and hence, the self-oscillation is suppressed. As a result, it is possible to maintain the self-oscillation at a small level where an erroneous operation of the semiconductor switch is not induced (see the waveform of the gate voltage $V_{GS}$ in the overload region 2 shown in FIG. 6 and FIG. 7).

In the semiconductor switch control circuit 16 according to the embodiment 1, assume a case where a gate voltage $V_{GS}$ which the gate voltage detecting part 21 detects during the second plateau period Tp2 exceeds the second set voltage V2. In such a case, a rising speed is not readily decreased (lowered) during the turn-on period, but is decreased (lowered) during a turn-on period at the time when the semiconductor switch is turned on by a next ON signal. With such a configuration, a control of the drive current control part can be performed at a speed which is not so high.

In a case where the second set voltage V2 is set to a voltage slightly higher than the threshold voltage Vth of the semiconductor switch, although a self-oscillation suppressing effect is increased, a turn-off period is prolonged and a switching speed becomes excessively slow. Accordingly, such setting of the second set voltage V2 is not desirable. On the other hand, in a case where the second set voltage V2 is set to a voltage considerably higher than the threshold voltage Vth of the semiconductor switch, a self-oscillation suppressing effect can not be sufficiently acquired. Accordingly, such setting of the second set voltage V2 is not desirable. From this point of view, it is preferable to set the second set voltage V2 to a value which takes into account a self-oscillation suppressing effect and a turn-off period.

Figure 8:
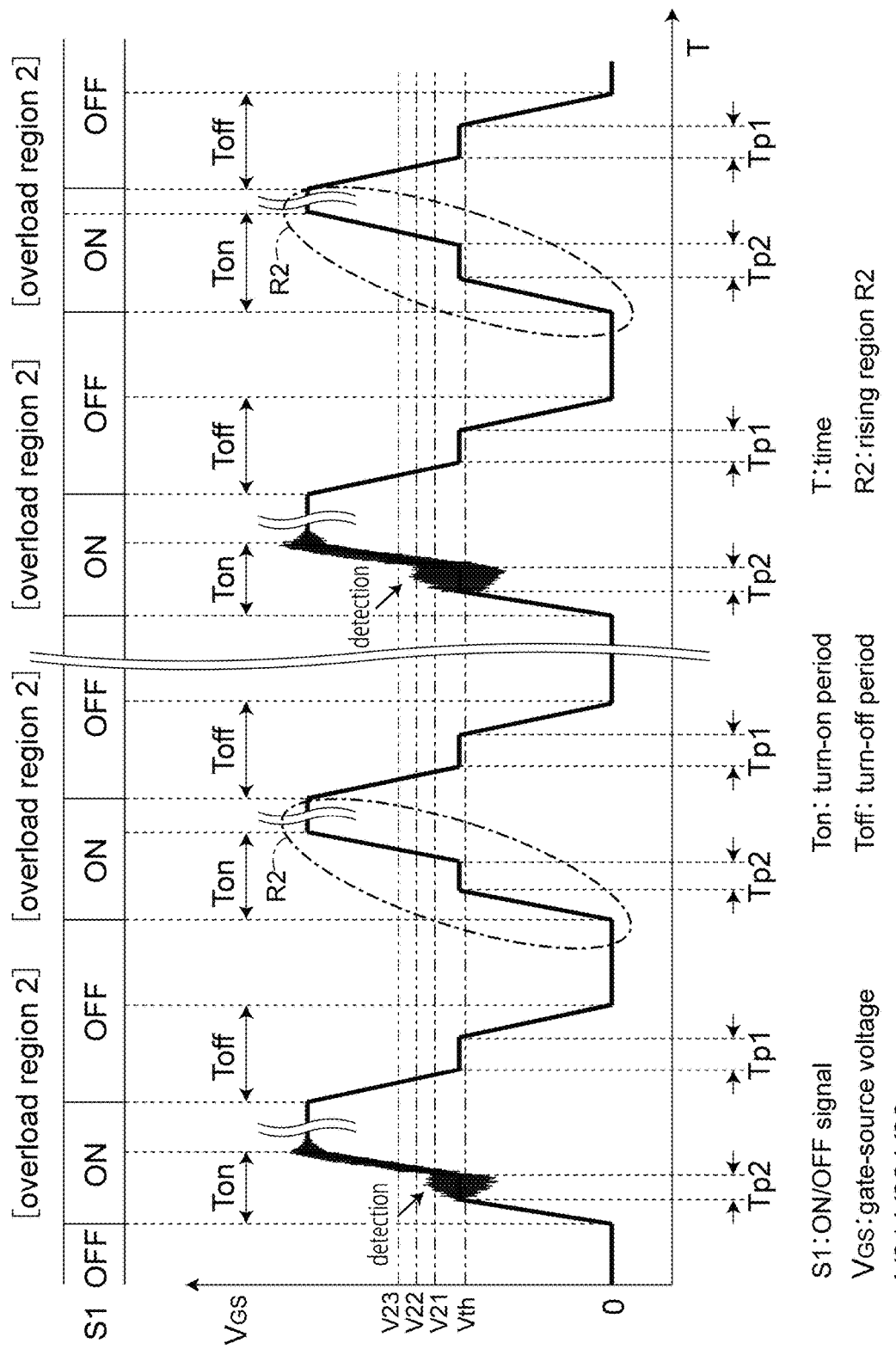
FIG. 8 is a view schematically showing a waveform of a gate voltage $V_{GS}$ at the time of performing a switching operation in a case where a plurality of voltage levels are set as a second set voltage V2 in a switching power source device according to an embodiment 2.

FIG. 8 is a view schematically showing a waveform of a gate voltage $V_{GS}$ at the time of performing a switching operation in a case where a plurality of voltage levels are set as the second set voltage V2 in the switching power source device 1 according to the embodiment 1. In the drawing, the waveforms of two gate voltages $V_{GS}$ on the left side are the waveform of the gate voltage $V_{GS}$ when the gate voltage $V_{GS}$ exceeds the second set voltage V21 in the overload region 2 and the waveform of the gate voltage $V_{GS}$ when a rising speed of the gate voltage $V_{GS}$ is decreased (see symbol R2) corresponding to such a phenomenon (the detection of a state where the gate voltage $V_{GS}$ exceeds the second set voltage V21). The waveforms of two gate voltages $V_{GS}$ on the right side are the waveform of the gate voltage $V_{GS}$ when the gate voltage $V_{GS}$ exceeds a first set voltage V22 (higher than the second set voltage V21) in the overload region 2 and the waveform of the gate voltage $V_{GS}$ when a rising speed of the gate voltage $V_{GS}$ is further decreased (see symbol R2) corresponding to such a phenomenon (the detection of a state where the gate voltage $V_{GS}$ exceeds the second set voltage V22).

In the semiconductor switch control circuit 16 according to the embodiment 1, as shown in FIG. 8, the drive current control part 22 may set a plurality of voltage levels (V21 to V23) as the second set voltage V2 and control a drive current such that a rising speed of the gate voltage $V_{GS}$ is decreased in a stepwise manner in accordance with a phenomenon that the gate voltage $V_{GS}$ exceeds the higher voltage level among the plurality of voltage levels. With such a configuration, a rising speed of the gate voltage can be properly controlled corresponding to a degree of danger that self-oscillation is generated and hence, it is possible to acquire a necessary self-oscillation suppressing effect without unnecessarily prolonging a turn-on period.

As shown in FIG. 8, as the plurality of voltage levels, for example, three voltage levels can be set. However, the present invention is not limited to such a case and, for example, two or four or more voltage levels can be set. As values of the plurality of voltage levels, appropriate values can be set so as to properly control a rising speed of the gate voltage corresponding to a degree of danger that the self-oscillation is generated.

In the semiconductor switch control circuit 16 according to the embodiment 1, the drive current control part 22 may control a drive current so as to set a rising speed of the gate voltage $V_{GS}$ lower than the rising speed of the gate voltage $V_{GS}$ before the detection of the self-oscillation phenomenon only when the gate voltage $V_{GS}$ which the gate voltage detecting part detects exceeds the second set voltage V2 plural times during the second plateau period Tp2. With such a configuration, self-oscillation can be effectively suppressed without unnecessarily prolonging a turn-on period by excluding an effect caused by singularly generated noise which does not lead to self-oscillation.

In the same manner as the case where the switching power source device is turned off, the number of times expressed by "plural times" may be preliminarily set such as twice, three times, four times, or five times. However, the number of times expressed by "plural times" may be set corresponding to a height of the above-mentioned "second set voltage V2". In this case, it is desirable to set the number of times expressed by "plural times" such that the height of "second set voltage V2" and the number of times expressed by "plural times" have the negative correlation. For example, when "second set voltage V2" is set high, the number of times expressed by "plural times" is decreased. Also with such a configuration, a rising speed of the gate voltage can be properly controlled corresponding to a degree of danger that self-oscillation is generated and hence, self-oscillation can be effectively suppressed without unnecessarily prolonging a turn-on period.

2. Advantageous effects of the semiconductor switch control circuit 16 and switching power source device 1 according to the embodiment 1

The semiconductor switch control circuit 16 and the switching power source device 1 according to the embodiment 1 includes the drive current control part 22 which controls a drive current which the drive current generating part 18 generates based on a pulse signal which the pulse signal generating part 17 generates and a gate voltage which the gate voltage detecting part 21 detects. Accordingly, by controlling a drive current such that a lowering speed of a gate voltage or a rising speed of the gate voltage is decreased (lowered) at the timing that a large switching current flows such as a time that the power source is started or a time that an overload is applied (see FIG. 3 and FIG. 5), it is possible to provide the semiconductor switch control circuit and the switching power source device which minimally cause a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied (see FIG. 4 and FIG. 7).

According to the semiconductor switch control circuit 16 of the embodiment 1, when a self-oscillation phenomenon of the gate voltage $V_{GS}$ is detected during the first period T1, a drive current is controlled so as to set a lowering speed of the gate voltage $V_{GS}$ lower than the lowering speed of the gate voltage $V_{GS}$ before the detection of the self-oscillation phenomenon. Accordingly, it is possible to acquire a sufficient self-oscillation suppressing effect at the time of turning off the semiconductor switch where self-oscillation is liable to be generated.

According to the semiconductor switch control circuit 16 of the embodiment 1, when the gate voltage $V_{GS}$ exceeds the first set voltage V1 during the first period T1, a drive current is controlled so as to set a lowering speed of the gate voltage $V_{GS}$ lower than a lowering speed of the gate voltage $V_{GS}$ before the detection of the self-oscillation phenomenon. Accordingly, it is possible to acquire a sufficient self-oscillation suppressing effect at the time of turning off the semiconductor switch where self-oscillation is liable to be generated.

According to the semiconductor switch control circuit 16 of the embodiment 1, the drive current is controlled such that the lowering speed of the gate voltage $V_{GS}$ is decreased in a stepwise manner in accordance with a phenomenon that the gate voltage $V_{GS}$ exceeds a higher voltage level among the plurality of voltage levels during the first period T1. Accordingly, a lowering speed of the gate voltage can be properly controlled corresponding to a degree of danger that self-oscillation is generated and hence, it is possible to acquire a necessary self-oscillation suppressing effect without unnecessarily prolonging a turn-off period.

According to the semiconductor switch control circuit 16 of the embodiment 1, a drive current is controlled so as to set a lowering speed of the gate voltage $V_{GS}$ lower than the lowering speed of the gate voltage $V_{GS}$ before the detection of the self-oscillation phenomenon only when the gate voltage $V_{GS}$ exceeds the first set voltage V1 plural times during the first period T1. Accordingly, self-oscillation can be effectively suppressed without unnecessarily prolonging a turn-off period by excluding an effect caused by singularly generated noise which does not lead to self-oscillation.

According to the semiconductor switch control circuit 16 of the embodiment 1, when a self-oscillation phenomenon of the gate voltage $V_{GS}$ is detected during a second plateau period Tp2, a drive current is controlled so as to set a rising speed of the gate voltage $V_{GS}$ lower than the rising speed of the gate voltage $V_{GS}$ before the detection of the self-oscillation phenomenon. Accordingly, a sufficient self-oscillation suppressing effect even at the time of turning on the semiconductor switch can be acquired.

According to the semiconductor switch control circuit 16 of the embodiment 1, the drive current is controlled so as to set the rising speed of the gate voltage $V_{GS}$ lower than the rising speed of the gate voltage $V_{GS}$ before the detection of the self-oscillation phenomenon when the gate voltage $V_{GS}$ exceeds the second set voltage V2 during the second plateau period Tp2. Accordingly, it is possible to acquire a sufficient self-oscillation suppressing effect at the time of turning on the semiconductor switch.

According to the semiconductor switch control circuit 16 of the embodiment 1, the drive current is controlled such that the rising speed of the gate voltage $V_{GS}$ is decreased in a stepwise manner in accordance with a phenomenon that the gate voltage $V_{GS}$ exceeds a higher voltage level among the plurality of voltage levels during the second plateau period Tp2. Accordingly, a rising speed of the gate voltage can be properly controlled corresponding to a degree of danger that self-oscillation is generated and hence, it is possible to acquire a necessary self-oscillation suppressing effect without unnecessarily prolonging a turn-on period.

According to the semiconductor switch control circuit 16 of the embodiment 1, a drive current is controlled so as to set a rising speed of the gate voltage $V_{GS}$ lower than the rising speed of the gate voltage $V_{GS}$ before the detection of the self-oscillation phenomenon only when the gate voltage $V_{GS}$ exceeds the second set voltage V2 plural times during the second plateau period Tp2. Accordingly, self-oscillation can be effectively suppressed without unnecessarily prolonging a turn-on period by excluding an effect caused by singularly generated noise which does not lead to self-oscillation.

According to the semiconductor switch control circuit 16 of the embodiment 1, the drive current generating part 18 includes a charge/discharge circuit which has a charge current source 19 for charging a current to the gate electrode of the semiconductor switch 6 and a discharge current source 20 for discharging the current from the gate electrode of the semiconductor switch 6, and the drive current control part 22 controls the drive current by controlling a charge current charged to the gate electrode of the semiconductor switch 6 or a discharge current discharged from the gate electrode of the semiconductor switch 6. Accordingly, control of the drive current is efficiently performed due to the operations of the charge current source and the discharge current source.

According to the semiconductor switch control circuit 16 of the embodiment 1, the semiconductor switch 6 is formed of a wide gap semiconductor (for example, silicon carbide, gallium nitride, gallium oxide, diamond or the like), and it is possible to realize the acquisition of high efficiency and miniaturization of the device due to characteristics of the wide gap semiconductor such as low ON resistance and high speed switching.

Embodiment 2

Figure 9:
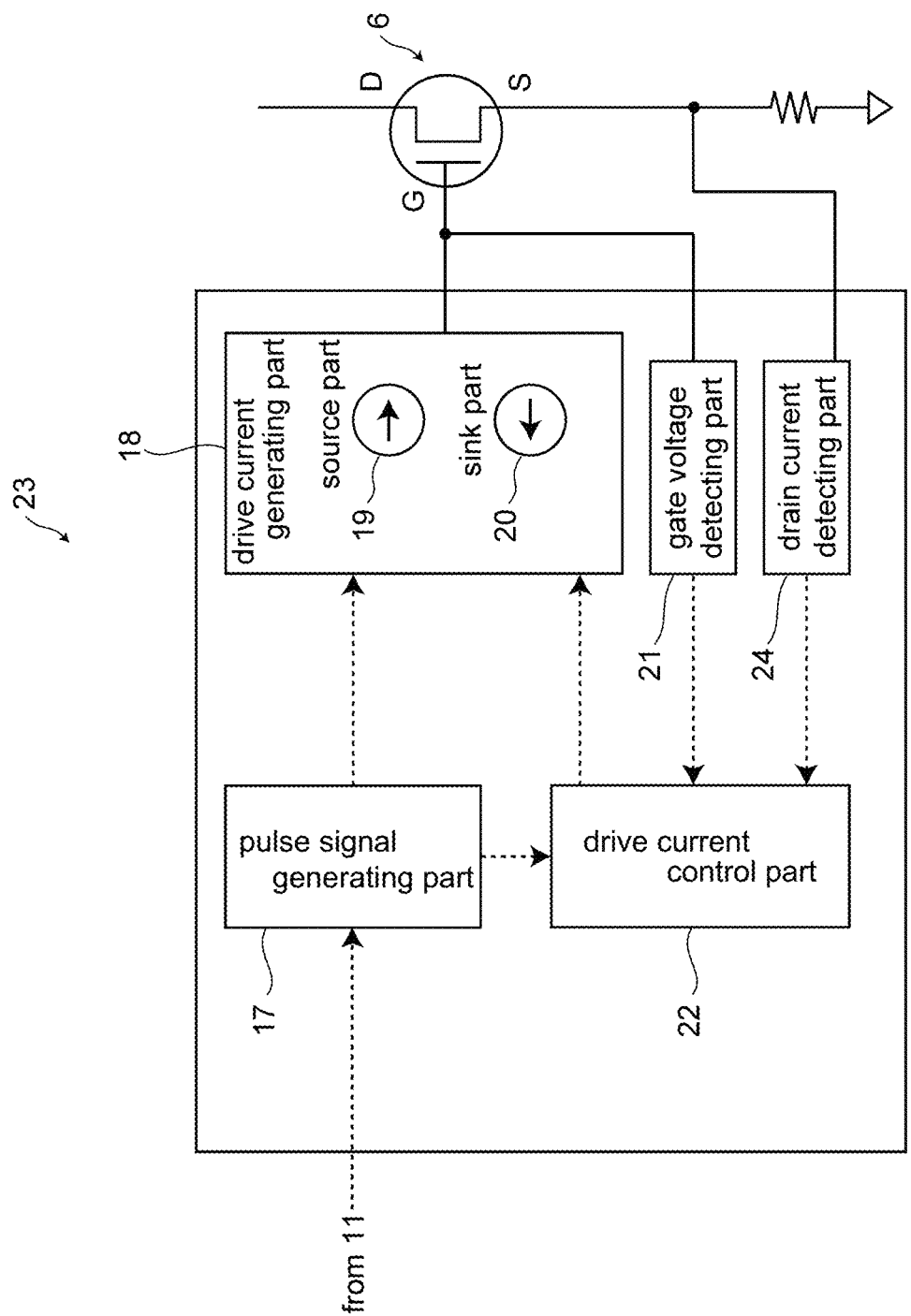
FIG. 9 is a view for describing a semiconductor switch control circuit 23 according to the embodiment 2.
Figure 10A:
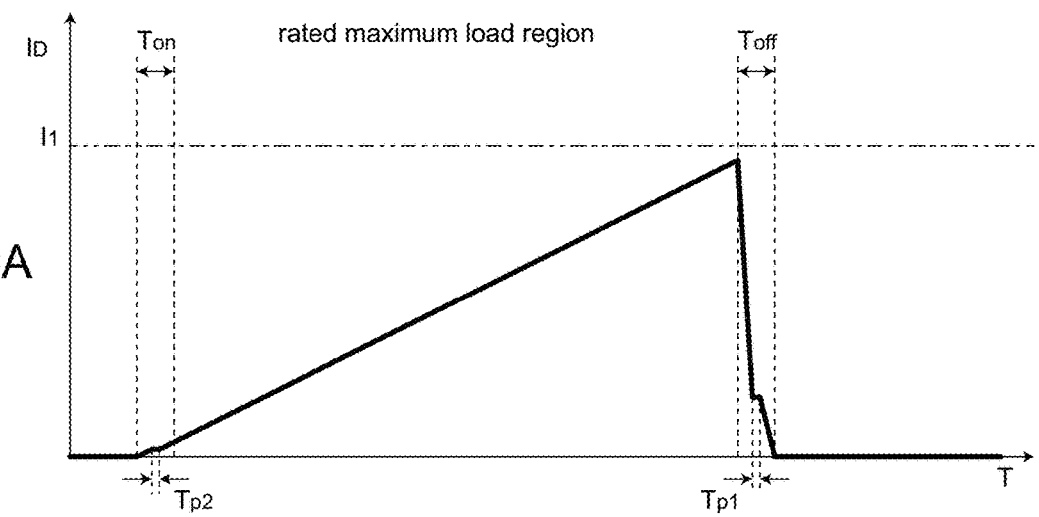
FIGS. 10A, 10B and 10C are views schematically showing a waveform of a drain current $I_D$ at the time of performing the switching operation in the switching power source device according to the embodiment 2.
Figure 10B:
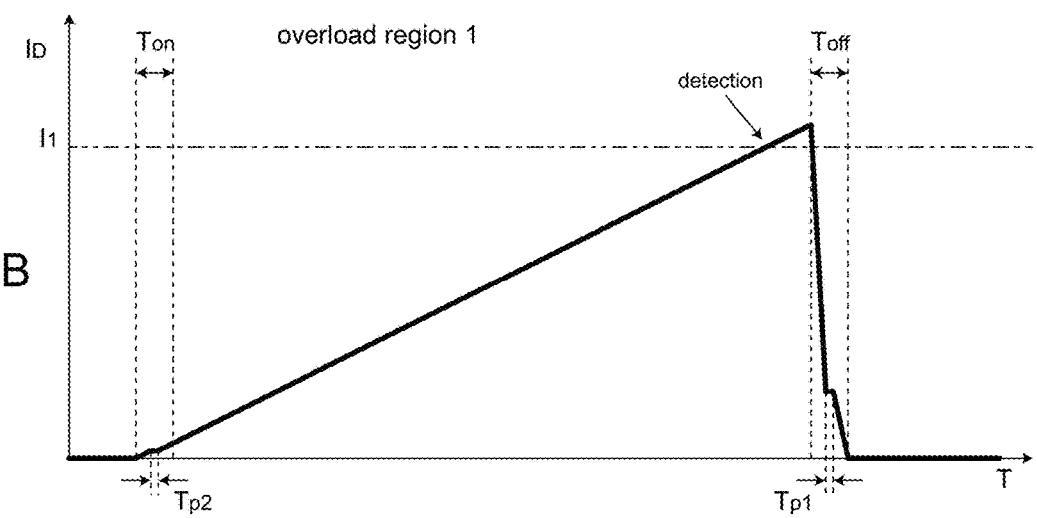
Figure 10C:
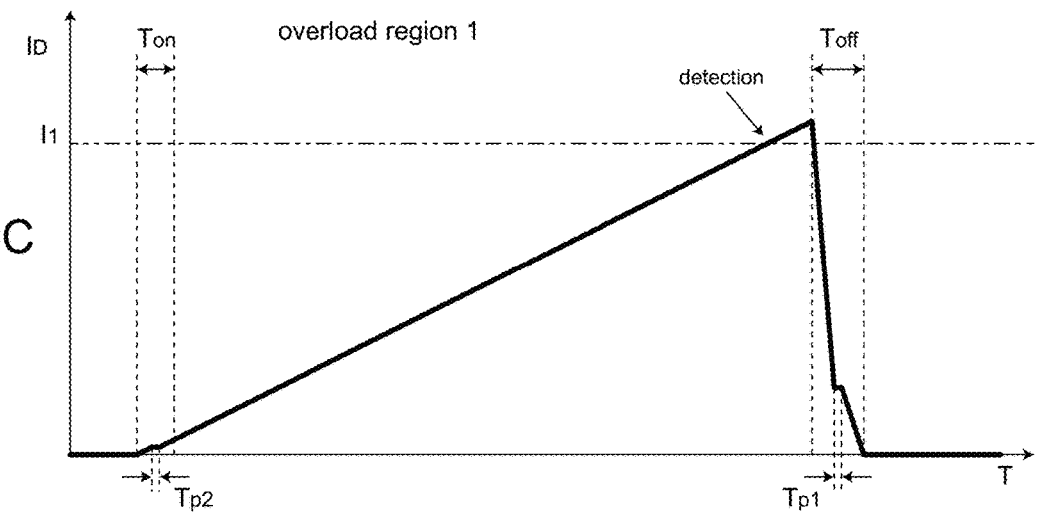
Figure 11A:
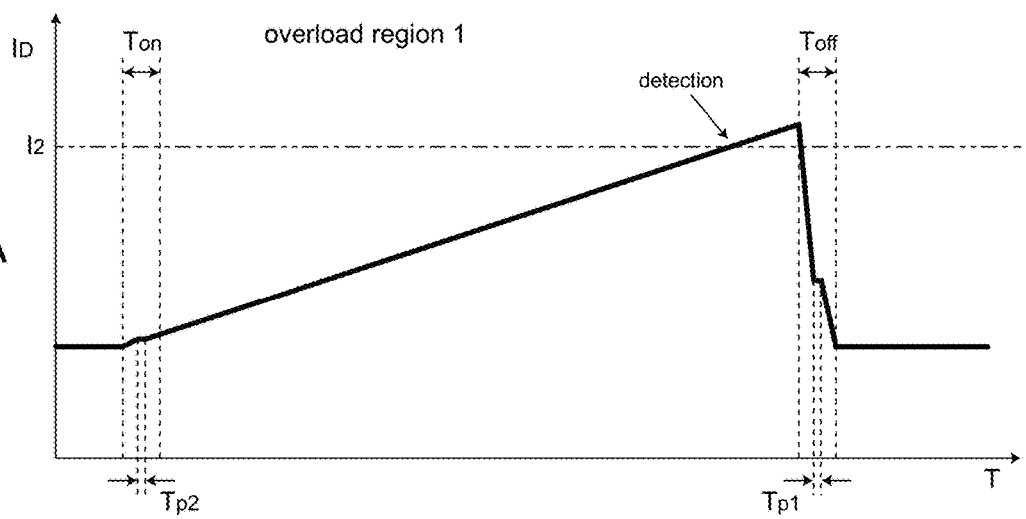
FIGS. 11A, 11B and 11C are views schematically showing the waveform of the drain current $I_D$ at the time of performing the switching operation in the switching power source device according to the embodiment 2.
Figure 11B:
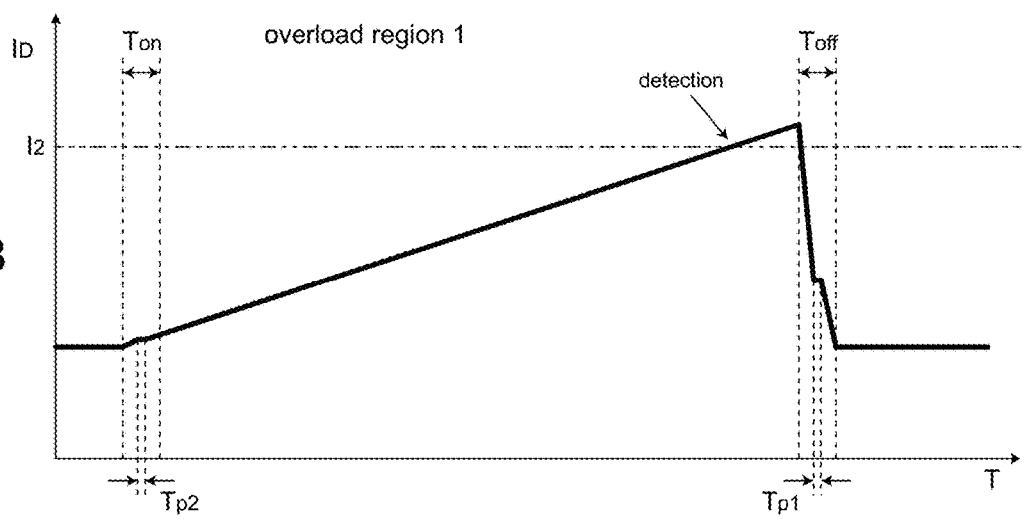
Figure 11C:
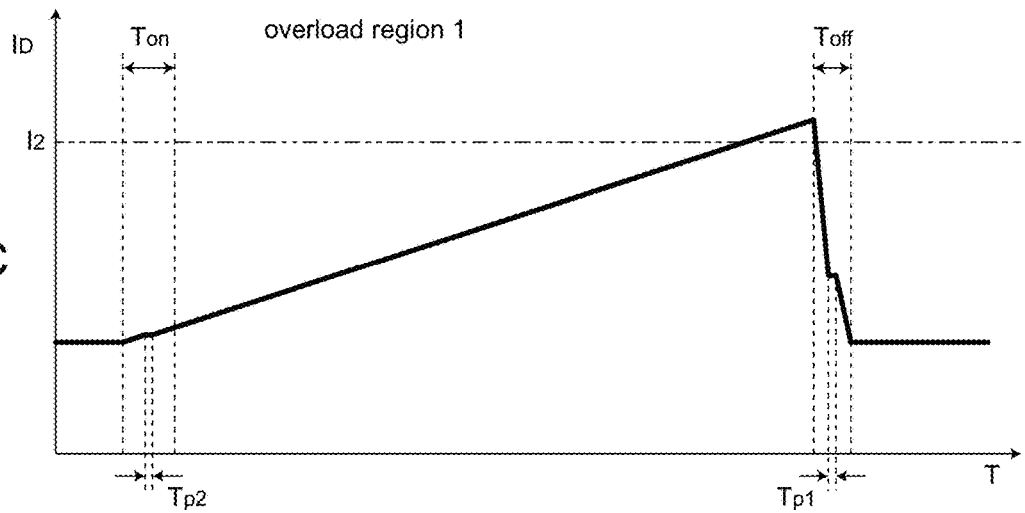
Figure 12:
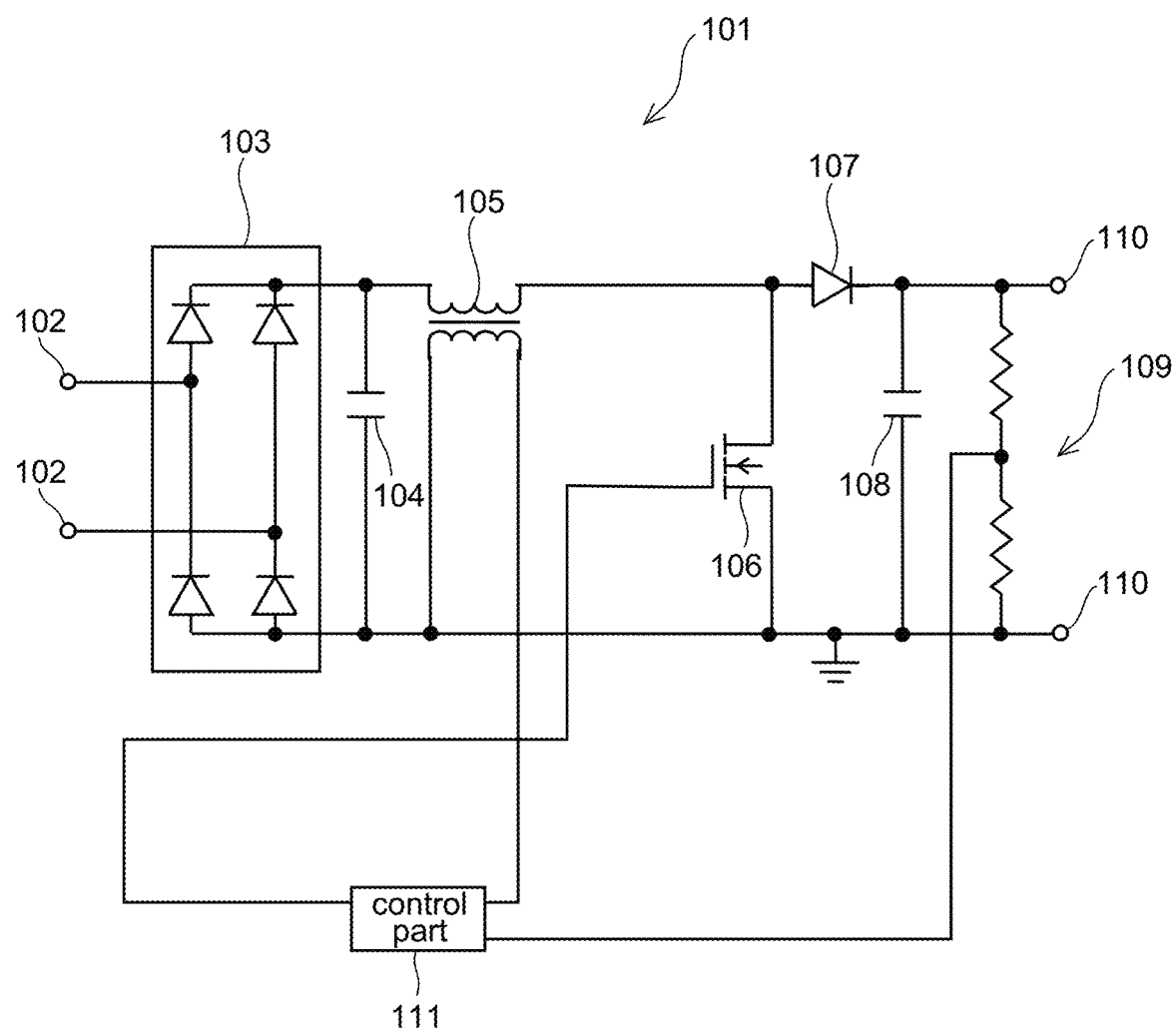
FIG. 12 is a circuit diagram of a conventional switching power source device 101.

FIG. 9 is a view for describing a semiconductor switch control circuit 23 according to an embodiment 2. FIGS. 10A, 10B and 10C are views schematically showing waveforms of a drain current $I_D$ at the time of performing a switching operation in a switching power source device which uses the semiconductor switch control circuit 23 according to the embodiment 2. Among these waveforms, the waveform of the drain current $I_D$ shown in FIG. 10A is a waveform of the drain current $I_D$ in a rated maximum load region, and the waveforms of the drain current $I_D$ shown in FIG. 10B and FIG. 10C are waveforms of the drain current $I_D$ in an overload region 1. However, the waveform of the drain current $I_D$ shown in FIG. 10C is a waveform of a drain current $I_D$ when a lowering speed of a gate voltage $V_{GS}$ in a turn-off period is decreased. FIGS. 11A, 11B and 11C are views schematically showing the waveforms of the drain current $I_D$ at the time of performing a switching operation in the switching power source device which uses the semiconductor switch control circuit 23 according to the embodiment 2. Among these waveforms, the waveform of the drain current $I_D$ shown in FIG. 11A is a waveform of the drain current $I_D$ in the rated maximum load region, and the waveforms of the drain current $I_D$ shown in FIG. 11B and FIG. 11C are waveforms of the drain current $I_D$ in the overload region 1. However, the waveform of the drain current $I_D$ shown in FIG. 11C is a waveform of a drain current $I_D$ when a rising speed of a gate voltage $V_{GS}$ in a turn-on period is decreased. FIGS. 10A, 10B and 10C are the views schematically showing the waveforms of the drain current $I_D$ when the semiconductor switch control circuit 23 according to the embodiment 2 is applied to a switching power source device formed of a critical-mode-type step-up chopper, and FIGS. 11A, 11B and 11C are the views schematically showing the waveforms of the drain current $I_D$ when the semiconductor switch control circuit 23 according to the embodiment 2 is applied to a switching power source device formed of a continuous-type step-up chopper.

The semiconductor switch control circuit 23 according to the embodiment 2 has substantially the same configuration as the semiconductor switch control circuit 16 according to the embodiment 1. However, the semiconductor switch control circuit 23 according to the embodiment 2 differs from the semiconductor switch control circuit 16 according to the embodiment 1 with respect to a point that the semiconductor switch control circuit 23 according to the embodiment 2 further includes a drain current detecting part 24. In other words, as shown in FIG. 9, the semiconductor switch control circuit 23 according to the embodiment 2 further includes the drain current detecting part 24 which detects a drain current $I_D$ of a semiconductor switch 6. Further, the drive current control part 22 controls a drive current, even when a gate voltage $V_{GS}$ exceeds a first set voltage or a second set voltage, so as to set a lowering speed or a rising speed of the gate voltage $V_{GS}$ lower than the corresponding speed before the detection of the self-oscillation phenomenon only when the drain current $I_D$ exceeds a first set current I1 (see FIGS. 10A, 10B and 10C) or second set current I2 (see FIGS. 11A, 11B and 11C) during an on period ON of the semiconductor switch 6 (see FIG. 10B and FIG. 10C and FIG. 11B and FIG. 11C). In other words, in the semiconductor switch control circuit 23 according to the embodiment 2, when the drain current $I_D$ does not exceed a predetermined first set current I1 or a predetermined second set current I2 during an on period ON of the semiconductor switch 6, a control of the drive current which sets a lowering speed or a rising speed of the gate voltage $V_{GS}$ lower than the corresponding lowering speed or rising speed before the detection of the self-oscillation phenomenon is not performed.

In this manner, the semiconductor switch control circuit 23 according to the embodiment 2 differs from the semiconductor switch control circuit 16 according to the embodiment 1 with respect to the point that the semiconductor switch control circuit 23 according to the embodiment 2 further includes the drain current detecting part 24. However, in the same manner as the semiconductor switch control circuit 16 according to the embodiment 1, the semiconductor switch control circuit 23 according to the embodiment 2 includes a drive current control part 22 which controls a drive current which a drive current generating part 18 generates based on a pulse signal which a pulse signal generating part 17 generates and a gate voltage $V_{GS}$ which a gate voltage detecting part 21 detects. Accordingly, the semiconductor switch control circuit 23 according to the embodiment 2 possesses substantially the same advantageous effects which the semiconductor switch control circuit 16 according to the embodiment 1 possesses. In other words, by controlling a drive current such that a lowering speed of a gate voltage $V_{GS}$ or a rising speed of the gate voltage $V_{GS}$ is decreased (lowered) at the timing that a large switching current flows such as at the time of starting the power source or at the time that an overload is applied, it is possible to provide the semiconductor switch control circuit and the switching power source device which minimally causes a phenomenon that a semiconductor switch or a circuit part around the semiconductor switch is broken due to self-oscillation and an erroneous operation of the semiconductor switch caused by the self-oscillation even at the timing that the large switching current flows such as at the time of starting the power source or at the time that an overload is applied.

Further, according to the semiconductor switch control circuit 23 of the embodiment 2, the drive current control part 22 controls a drive current so as to set a lowering speed or a rising speed of the gate voltage of the gate voltage $V_{GS}$ lower than the corresponding lowering speed or rising speed before the detection of the self-oscillation phenomenon only when the drain current $I_D$ exceeds the predetermined first set current I1 or second set current I2 during an ON period of the semiconductor switch 6.

Accordingly, by setting a magnitude of a first set current I1 or a second set current I2 to a suitable value, a lowering speed or a rising speed of the gate voltage can be properly controlled corresponding to a degree of danger that self-oscillation is generated. Accordingly, it is possible to acquire a necessary self-oscillation suppressing effect without unnecessarily prolonging a turn-off period and a turn-on period.

The present invention has been described heretofore based on the above-mentioned embodiments, the present invention is not limited to the above-mentioned embodiments. Various modifications can be carried out without departing from the gist of the present invention, and the following modifications are conceivable, for example.

(1) In the above-mentioned embodiment 1, the case is assumed where the gate voltage $V_{GS}$ exceeds the first set voltage V1 during the first period T1, a lowering speed is not readily decreased (lowered) during the turn-off period, but is decreased (lowered) during a turn-off period after the semiconductor switch is turned on by a next ON signal. However, the present invention is not limited to such a configuration. A lowering speed may be deceased (lowered) readily during the turn-off period. With such a configuration, it is possible to acquire a larger self-oscillation suppressing effect.

(2) In the above-mentioned embodiment 1, the case is assumed where the gate voltage $V_{GS}$ exceeds the second set voltage V2 during the second plateau period Tp2, a rising speed is not readily decreased (lowered) during the turn-on period, but is decreased (lowered) at the time of turning on the semiconductor switch by a next ON signal. However, the present invention is not limited to such a configuration. A rising speed may be deceased (slow) readily during the turn-on period. With such a configuration, it is possible to acquire a larger self-oscillation suppressing effect.

(3) In the above-mentioned embodiment 2, the case is assumed where the drain current detecting part 24 which detects the drain current $I_D$ of the semiconductor switch 6 is used as a current detecting part. However, the present invention is not limited to such a configuration. A source current detecting part which detects a source current of the semiconductor switch may be used as the current detecting part. Further, other current detecting part which can detect a load current or an input current of the switching power source device may be used as the current detecting part.

(4) In the above-mentioned respective embodiments, the case is assumed where the semiconductor switch using a wide band gap semiconductor is used as a semiconductor switch.

However, the present invention is not limited to such a configuration. For example, a usual semiconductor switch using silicon may be used as the semiconductor switch.

(5) In the above-mentioned respective embodiments, the case is assumed where the semiconductor switch control circuits 16, 23 are disposed between the control part 11 and the semiconductor switch 6. However, the present invention is not limited to such a configuration. A semiconductor switch control circuit may be integrally formed by assembling the semiconductor switch control circuit into the inside of a control part.

(6) In the above-mentioned respective embodiments, the case is assumed where the semiconductor switch control circuit is used for controlling the semiconductor switch in the switching power source device formed of a step-up chopper. However, the present invention is not limited to such a configuration. A semiconductor switch control circuit may be used for controlling a semiconductor switch in a switching power source devices other than the switching power source device formed of a step-up chopper. For example, a semiconductor switch control circuit may be used for controlling a semiconductor switch of a switching power source device formed of a step-down chopper or a step-up/down chopper, a flyback power source such as a PWM (Pulse Width Modulation) or an RCC (Ringing Choke Converter) and the like.

The invention claimed is:

1. A semiconductor switch control circuit configured to perform an ON/OFF control of a semiconductor switch having a source electrode, a drain electrode and a gate electrode by supplying a drive current to the gate electrode, the semiconductor switch control circuit comprising:
a pulse signal generating part configured to generate a pulse signal which becomes a time reference for performing the ON/OFF control of the semiconductor switch;
a drive current generating part configured to generate the drive current based on the pulse signal which the pulse signal generating part generates and to supply the drive current to the gate electrode of the semiconductor switch;
a gate voltage detecting part configured to detect a gate voltage of the semiconductor switch; and
a drive current control part configured to control the drive current which the drive current generating part generates based on the pulse signal which the pulse signal generating part generates and the gate voltage which the gate voltage detecting part detects,
wherein the drive current control part is configured, when a self-oscillation phenomenon of the gate voltage is detected during a first period after starting a first plateau period of the gate voltage during a turn-off period, to control the drive current so as to set a lowering speed of the gate voltage lower than the lowering speed of the gate voltage before the detection of the self-oscillation phenomenon.

2. The semiconductor switch control circuit according to claim 1, wherein the drive current control part is configured, when the gate voltage exceeds a first set voltage which is higher than a threshold voltage of the semiconductor switch by a predetermined value during the first period after starting of the first plateau period of the gate voltage during the turn-off period, to control the drive current so as to set the lowering speed of the gate voltage lower than the lowering speed of the gate voltage before the detection of the self-oscillation phenomenon.

3. The semiconductor switch control circuit according to claim 2, wherein the drive current control part is configured to set a plurality of voltage levels as the first set voltage, and is configured to control the drive current such that the lowering speed of the gate voltage is decreased in a stepwise manner in accordance with a phenomenon that the gate voltage exceeds a higher voltage level among the plurality of voltage levels during the first period.

4. The semiconductor switch control circuit according to claim 2, wherein the drive current control part is configured, only when the gate voltage exceeds the first set voltage plural times during the first period, to control the drive current so as to set the lowering speed of the gate voltage lower than the lowering speed of the gate voltage before the detection of the self-oscillation phenomenon.

5. The semiconductor switch control circuit according to claim 2, further comprising a current detecting part which is configured to detect any one of a drain current or a source current of the semiconductor switch, or a load current or an input current of a switching power source device including the semiconductor switch, wherein
the drive current control part is configured, only when the current exceeds a predetermined first set current during an ON period of the semiconductor switch, to control the drive current so as to set the lowering speed of the gate voltage lower than the lowering speed of the gate voltage before the detection of the self-oscillation phenomenon.

6. The semiconductor switch control circuit according to claim 1, wherein the drive current control part is configured, when a further self-oscillation phenomenon of the gate voltage is detected during a second plateau period of the gate voltage during a turn-on period, to control the drive current so as to set a rising speed of the gate voltage lower than the rising speed of the gate voltage before the detection of the further self-oscillation phenomenon.

7. The semiconductor switch control circuit according to claim 6, wherein the drive current control part is configured, when the gate voltage exceeds a second set voltage which is higher than a threshold voltage of the semiconductor switch by a predetermined value during the second plateau period of the gate voltage during the turn-on period, to control the drive current so as to set the rising speed of the gate voltage lower than the rising speed of the gate voltage before the detection of the further self-oscillation phenomenon.

8. The semiconductor switch control circuit according to claim 7, wherein the drive current control part is configured to set a plurality of voltage levels as the second set voltage, and is configured to control the drive current such that the rising speed of the gate voltage is decreased in a stepwise manner in accordance with a phenomenon that the gate voltage exceeds a higher voltage level among the plurality of voltage levels during the second plateau period.

9. The semiconductor switch control circuit according to claim 7, wherein the drive current control part is configured, only when the gate voltage exceeds the second set voltage plural times during the second plateau period, to control the drive current so as to set the rising speed of the gate voltage lower than the rising speed of the gate voltage before the detection of the further self-oscillation phenomenon.

10. The semiconductor switch control circuit according to claim 7, further comprising a current detecting part which is configured to detect any one of a drain current or a source current of the semiconductor switch, or a load current or an input current of a switching power source device including the semiconductor switch, wherein
the drive current control part is configured, only when the current exceeds a predetermined second set current during an ON period of the semiconductor switch, to control the drive current so as to set the rising speed of the gate voltage lower than the rising speed of the gate voltage before the detection of the further self-oscillation phenomenon.

11. The semiconductor switch control circuit according to claim 1, wherein the drive current generating part includes a charge/discharge circuit which has a charge current source for charging a current to the gate electrode of the semiconductor switch and a discharge current source for discharging the current from the gate electrode of the semiconductor switch, and the drive current control part is configured to control the drive current by controlling a charge current charged to the gate electrode of the semiconductor switch or a discharge current discharged from the gate electrode of the semiconductor switch.

12. The semiconductor switch control circuit according to claim 1, wherein the semiconductor switch is formed of a wide gap semiconductor.

13. The semiconductor switch control circuit according to claim 12, wherein the wide gap semiconductor is formed of silicon carbide, gallium nitride, gallium oxide or diamond.

14. A switching power source device comprising:

a semiconductor switch having a source electrode, a drain electrode and a gate electrode; and a semiconductor switch control circuit configured to perform an ON/OFF control of the semiconductor switch with a supply of a drive current to the gate electrode of the semiconductor switch, wherein the semiconductor switch control circuit comprises:

a pulse signal generating part configured to generate a pulse signal which becomes a time reference for performing the ON/OFF control of the semiconductor switch;

a drive current generating part configured to generate the drive current based on the pulse signal which the pulse signal generating part generates and to supply the drive current to the gate electrode of the semiconductor switch;

a gate voltage detecting part configured to detect a gate voltage of the semiconductor switch; and a drive current control part configured to control the drive current which the drive current generating part generates based on the pulse signal which the pulse signal generating part generates and the gate voltage which the gate voltage detecting part detects, wherein the drive current control part is configured, when a self-oscillation phenomenon of the gate voltage is detected during a first period after starting a first plateau period of the gate voltage during a turn-off period, to control the drive current so as to set a lowering speed of the gate voltage lower than the lowering speed of the gate voltage before the detection of the self-oscillation phenomenon.

* * * * *